(12) United States Patent
Kukula et al.

(10) Patent No.: US 7,092,858 B1
(45) Date of Patent: Aug. 15, 2006

(54) METHOD AND APPARATUS FOR FORMALLY CONSTRAINING RANDOM SIMULATION

(75) Inventors: James Herbert Kukula, Hillsboro, OR (US); Thomas Robert Shiple, Cupertino, CA (US); Rajeev Kumar Ranjan, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 913 days.

(21) Appl. No.: 10/046,220

(22) Filed: Jan. 16, 2002

Related U.S. Application Data

(60) Provisional application No. 60/262,488, filed on Jan. 17, 2001.

(51) Int. Cl.
*G06F 17/10* (2006.01)

(52) U.S. Cl. .......................... 703/2; 709/224; 717/124
(58) Field of Classification Search ............... 703/2; 717/120, 124, 128, 131; 709/224
See application file for complete search history.

(56) References Cited

U.S. PATENT DOCUMENTS

| 5,963,447 | A * | 10/1999 | Kohn et al. ............... 700/49 |
| 6,275,976 | B1 * | 8/2001 | Scandura .................. 717/120 |
| 6,289,502 | B1 * | 9/2001 | Garland et al. ............ 717/104 |
| 6,668,203 | B1 * | 12/2003 | Cook et al. ................ 700/65 |
| 6,789,116 | B1 * | 9/2004 | Sarkissian et al. ......... 709/224 |

OTHER PUBLICATIONS

H. Cho, G. D. Hachtel, E. Macii, B. Plessier, and F. Somenzi. "Algorithms for Approximate FSM Traversal." Proc. 30th ACM/IEEE Design Automation Conference, pp. 25-30, 1993.

H. Cho, G. D. Hachtel, E. Macii, M. Poncino, and F. Somenzi. "A Structural Approach to State Space Decomposition for Approximate Reachability Analysis." In Proc. IEEE Intl. Conf. on Computer Design (ICCD), Oct. 10-12, 1994, pp236-239.

H. Cho, G. D. Hachtel, E. Macii, M. Poncino, and F. Somenzi. "Automatic State Space Decomposition for Approximate FSM Traversal Based on Circuit Analysis." IEEE Transactions on Computer-Aided Design of Integrated Circuits and Systems, vol. 15, No. 12, Dec. 1996, pp1451-1464.

(Continued)

*Primary Examiner*—Albert W. Paladini
(74) *Attorney, Agent, or Firm*—Jonathan T. Kaplan

(57) ABSTRACT

In a finite state machine ($FSM_{verify}$) a set of goal states, to be searched for their reachability from a start state, is defined.

An overapproximated path is found from a start state to a goal state by a forward approximation technique. The overapproximated path representation relies upon a partitioning of the state and input bits of $FSM_{verify}$. A state matrix of the overapproximated path is organized by time-steps of $FSM_{verify}$ along a first dimension and by partitions of $FSM_{verify}$ state bits along a second dimension.

An underapproximated path, along the path of the stepping stone matrix, is determined. Underapproximation is typically accomplished by simulation.

A sequence of states to be output is updated with the underapproximated path.

If a start to goal state sequence has been found, the procedure ends. Otherwise, the above steps of over and under approximation are repeated, using the results of the last underapproximation as a start state.

34 Claims, 49 Drawing Sheets

OTHER PUBLICATIONS

H. Cho, G. D. Hachtel, E. Macii, B. Plessier, and F. Somenzi. "Algorithms for Approximate FSM Traversal Based on State Space Decomposition." IEEE Transactions on Computer-Aided Design of Integrated Circuits and Systems, vol. 15, No. 12, Dec. 1996, pp1465-1478.

C. H. Yang and D. L. Dill. "Validation with Guided Search of the State Space." In Proc. of the Design Automation Conf., Jun. 1998, pp599-604.

Govindaraju, G. S. and Dill. D. L. "Verification by Approximate Forward and Backward Reachability." IEEE/ACM ICCAD, pp. 366-370, Nov. 8-12, 1998.

Jun Yuan, Jian Shen, Jacob Abraham, and Adnan Aziz, "On Combining Formal and Informal Verification," in Proceedings of Conference on Computer-Aided Verification. Haifa. ISRAEL, Jul. 1997. 12 pages.

\* cited by examiner

FIGURE 3

SSFD

SSRA

SURA

SSRS

SURS

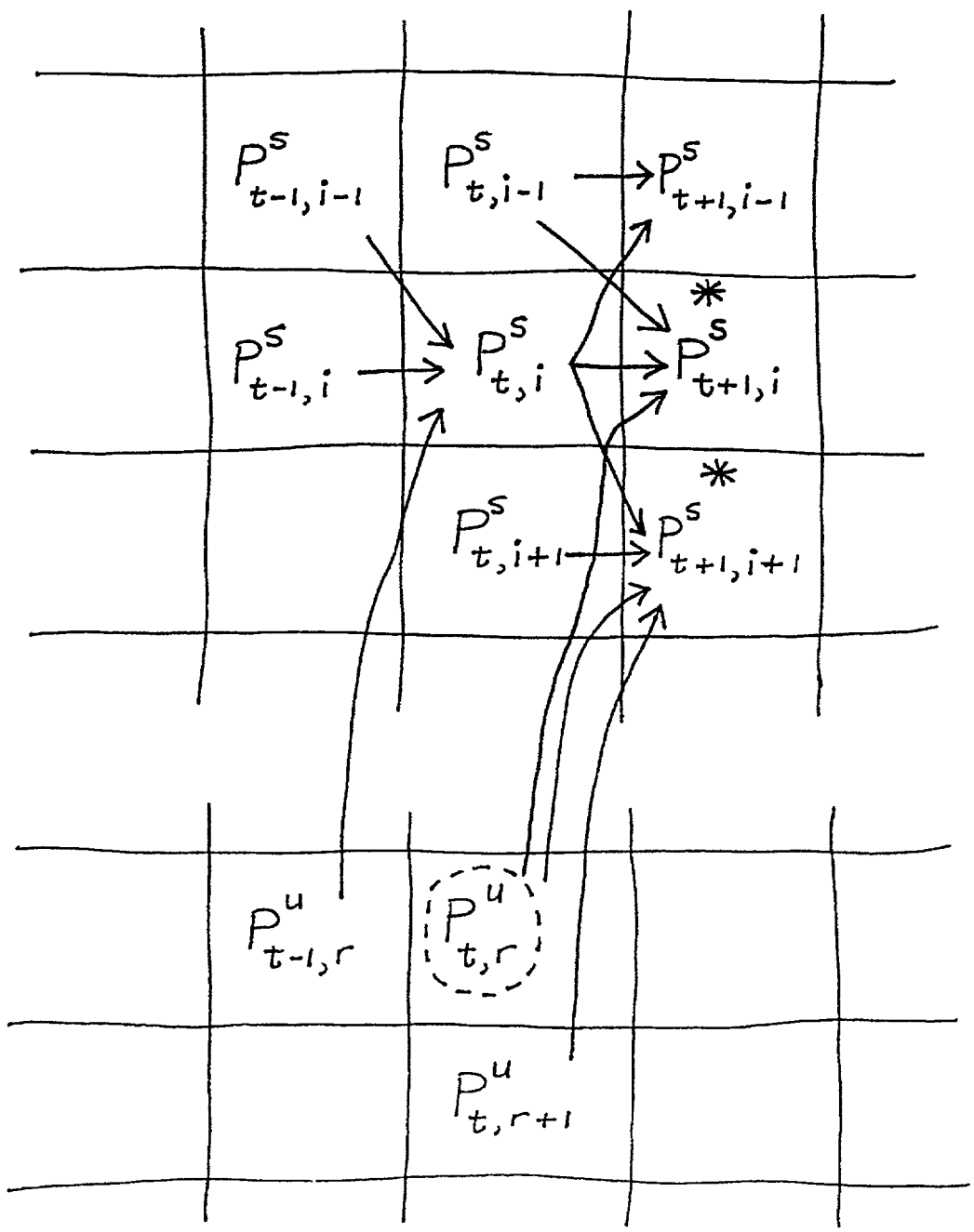

USRS

UURS

Figure 5A

```
1   /* Note that in following declaration "path" is a pseudo data type which is not part
2   of the C language */
3   path   approx_path;
4   /* the "approx_path" of the "path" type is structured into the following 3 main
5   subparts:
6           "state_sets" is a matrix organized as follows:
```

$$P_{0,1}^S \quad P_{1,1}^S \quad \ldots \quad P_{max\_time,1}^S$$

$$P_{0,2}^S \quad P_{1,2}^S \quad \ldots \quad P_{max\_time,2}^S$$

.

.

.

$$P_{0,n}^S \quad P_{1,n}^S \quad \ldots \quad P_{max\_time,n}^S$$

"input_sets" is a matrix organized as follows:

$$P_{0,1}^U \quad P_{1,1}^U \quad \ldots \quad P_{max\_time,1}^U$$

$$P_{0,2}^U \quad P_{1,2}^U \quad \ldots \quad P_{max\_time,2}^S$$

.

.

.

$$P_{0,m}^U \quad P_{1,m}^U \quad \ldots \quad P_{max\_time,m}^U$$

"max_time," is the max time value of state_sets and input sets
*/

Figure 5B

```
1    /* Bidirectional Approximate Reachability Narrowing */
2
3    bidirectional_approx(approx_path)
4    {
5           list rev_comps; /* list of reverse image computations to be performed */
6           list fwd_comps; /* list of forward image computations to be performed */
7
8           /* the approx_path data type is described above */
9
10          Sets of state for max_time, $P^S_{max\_time,1}, P^S_{max\_time,2}, ... P^S_{max\_time,n}$, are initially shrunk
11          by replacing them with their intersection with $E^S_1, E^S_2, ... E^S_n$;
12
13          For each $P^S_{max\_time,i}$ shrunken by its intersection with $E^S_i$ schedule it as the
14          " j " term of any reverse image computations to be performed on its fanin by
15          putting it on rev_comps;
16
17          /* Main loop whereby overapproximate sets, between start and goal states,
18          are shrunken */
19          while (non_empty?( rev_comps) OR non_empty?( fwd_comps))
20          {
21                  /* do all rev comps, and all addi rev comps brought up by doing the
22                  existing rev comps, on rev comp list, where list is sorted such that
23                  rev comps, latest in time, are done first */
24                  for each j_term on rev_comps
25                  {
26                          i_terms = state_fanin(j_term);
27                          r_terms = input_fanin(j_term);
```

Figure 5C

```
1   for each i_term on i_terms
2   {
3           new_i_term = rev_shrink_2pt2(i_term, j_term);
4           if empty(new_i_term) then return(no_path_exists);
5
6           if new_i_term < i_term then
7           {
8                   replace term in approx_path.state_sets,
9                   corresponding to i_term, with new_i_term;
10
11                  new_j_terms = revs_triggered?(new_i_term);
12
13                  put new_j_terms on rev_comps immediately,
14                  and re-sort rev_comps such that the j_term's
15                  continue to be taken in latest time first order;
16
17                  new_fwd_comps =
18                  fwds_triggered?(new_i_term);
19
20                  put new_fwd_comps on fwd_comps
21                  immediately, and re-sort fwd_comps such that
22                  its terms continue to be taken in earliest time
23                  first order;
24          } /* END if new_i_term < i_term */
25  } /* END for each i_term on i_terms */
```

Figure 5D

```
1      for each r_term on r_terms
2      {
3              new_r_term = rev_shrink_2pt3(r_term, j_term);
4              if empty(new_r_term) then return(no_path_exists);
5
6              if new_r_term < r_term then
7              {
8                      replace term in approx_path.input _sets,
9                      corresponding to r_term, with new_r_term;
10
11                     new_j_terms = revs_triggered?(new_r_term);
12
13                     put new_j_terms on rev_comps immediately,
14                     and re-sort rev_comps such that the j_term's
15                     continue to be taken in latest time first order;
16
17                     new_fwd_comps =
18                     fwds_triggered?(new_r_term);
19
20                     put new_fwd_comps on fwd_comps
21                     immediately, and re-sort fwd_comps such that
22                     its terms continue to be taken in earliest time
23                     first order;
24             } /* END if new_r_term < r_term */
25     } /* END for each r_term on r_terms */
26  } /* END for each j_term on rev_comps */
```

Figure 6A

```
1
2
3
4     /* All calls or process spawnings in the following pseudocode are by value,
5     meaning that the called routine or spawned process gets its own copy of the
6     passed parameters. */
7
8     /* DECLARATIONS FOLLOW (note that certain types are "pseudo" data types not
9     part of the C language) */
10
11    int     lwr_prio;
12    int     max_prio;
13
14    state   initial_state;
15    list    error_states;
16    list    actual_path;
17    hash    previously_found_states; /* "hash" is a pseudo data type which creates a
18    hash table; previously_found_states is a global hash table where all states
19    generated, beyond initial_state, are kept track of */
20    path    approx_path;
21    /* the "approx_path" of the "path" type is structured into the following 3 main
22    subparts:
23            "state_sets" is a matrix organized as follows:
```

$$P_{0,1}^S \quad P_{1,1}^S \quad \ldots \quad P_{max\_time,1}^S$$

$$P_{0,2}^S \quad P_{1,2}^S \quad \ldots \quad P_{max\_time,2}^S$$

.
.
.

$$P_{0,n}^S \quad P_{1,n}^S \quad \ldots \quad P_{max\_time,n}^S$$

"input_sets" is a matrix organized as follows:

$$P_{0,1}^U \quad P_{1,1}^U \quad \ldots \quad P_{max\_time,1}^U$$

$$P_{0,2}^U \quad P_{1,2}^U \quad \ldots \quad P_{max\_time,2}^S$$

.
.
.

$$P_{0,m}^U \quad P_{1,m}^U \quad \ldots \quad P_{max\_time,m}^U$$

"max_time," is the max time value of state_sets and input sets*/

Figure 6B

```
1    /* INITIALIZATIONS FOLLOW: */
2
3    /* Note that priority decreases as the priority number increases */
4    lwr_prio = 1;
5    max_prio = 1;
6
7    initial_state = $s_{0,1}, s_{0,2} ... s_{0,n}$ ;
8    error_states = $E_1^S, E_2^S, ... E_n^S$ ;
9    actual_path = ( (($s_{0,1}, s_{0,2} ... s_{0,n}$), NULL_input) ); /* Note that initial state of actual
10   path is paired with NULL_input to symbolize that primary input combination to be
11   applied for getting to next state along an error path has not been found yet. */
```

Figure 6C

```
1    /* Initial Process */
2
3    approx_path is initialized as follows:
4        state_sets (each set $P^S_{0,r}$ accepts only its corresponding portion of initial
5        state $s_{0,1}, s_{0,2} ... s_{0,n}$):
6            $P^S_{0,1}$
7            $P^S_{0,2}$
8            .
9            .
10           .
11           $P^S_{0,n}$
12
13       input_sets (each set $P^U_{0,r}$ accepts any combination of inputs applied to it):
14           $P^U_{0,1}$
15           $P^U_{0,2}$
16           .
17           .
18           .
19           $P^U_{0,m}$
20
21       max_time is 0
22
23   if each partition of initial_state has a non-null intersection with the corresponding
24   partition of error_states
25       then return initial_state as being a path to an error and end verification;
26
27       else spawn_process( max_prio; forward_approx(approx_path, actual_path)
28       )
```

Figure 6D

```
1    /* Foward Approximate Reachability Process */
2
3    forward_approx(approx_path, actual_path)
4
5            Determine $P^S_{t,1}, P^S_{t,2}, ... P^S_{t,n}$ from $P^S_{t-1,1}, P^S_{t-1,2}, ... P^S_{t-1,n}$, where each $P^S_{t,i}$ is
6            determined according to the following equation:
7
                $P^S_{t,i}(s_{t,i}) = \exists s_{t-1,a_1}, \exists s_{t-1,a_2}, ... \exists s_{t-1,a_q}, \exists u_i$
8                $[P^S_{t-1,a_1}(s_{t-1,a_1}), P^S_{t-1,a_2}(s_{t-1,a_2}), ... P^S_{t-1,a_q}(s_{t-1,a_q}) \wedge$
                $T_t(s_{t-1,a_1}, s_{t-1,a_2}, ... s_{t-1,a_q}, u_i, s_{t,i})]$
9
10           The functions of the above equation, having been expressed as
11           BDDs, are combinable, according to the above operators, according
12           to known techniques for BDD manipulation.
13
14   aug_approx_path = approx_path with the additional time step values of
15   $P^S_{t,1}, P^S_{t,2}, ... P^S_{t,n}$ added to state_sets, and max_time incremented by 1;
16
17   spawn_process( local_prio () + lwr_prio; forward_approx(aug_approx_path,
18   actual_path) );
19           /* local_prio () returns priority level of process in which local_prio is
20           being executed */
21
22           /* start another forward_approx, but at a lwr level of priority */
23
24   if intersection of each member of $P^S_{t,1}, P^S_{t,2}, ... P^S_{t,n}$ with its corresponding
25   member of $E^S_1, E^S_2, ... E^S_n$ is non-null then spawn_process(max_prio,
26   bidirectional_approx(aug_approx_path, actual_path);
```

Figure 6E

```
1   /* Bidirectional Approximate Reachability Narrowing */
2
3   bidirectional_approx(approx_path, actual_path)
4   {
5       list rev_comps; /* list of reverse image computations to be performed */
6       list fwd_comps; /* list of forward image computations to be performed */
7
8       /* the approx_path data type is described above */
9
10      Sets of state for max_time, $P^S_{max\_time,1}, P^S_{max\_time,2}, \ldots P^S_{max\_time,n}$, are shrunk by
11      replacing them with their intersection with $E^S_1, E^S_2, \ldots E^S_n$;
12
13      For each $P^S_{max\_time,i}$ shrunken by its intersection with $E^S_i$ schedule it as the
14      "j" term of any reverse image computations to be performed on its fanin by
15      putting it on rev_comps;
16
17      /* Main loop whereby overapproximate sets, between start and goal states,
18      are shrunken */
19      while (non_empty?( rev_comps) OR non_empty?( fwd_comps))
20      {
21          /* do all rev comps, and all addi rev comps brought up by doing the
22          existing rev comps, on rev comp list, where list is sorted such that
23          rev comps, latest in time, are done first */
24          for each j_term on rev_comps
25          {
26              i_terms = state_fanin(j_term);
27              r_terms = input_fanin(j_term);
```

Figure 6F

```
1    for each i_term on i_terms
2    {
3            new_i_term = rev_shrink_2pt2(i_term, j_term);
4            if empty(new_i_term) then return(no_path_exists);
5
6            if new_i_term < i_term then
7            {
8                    replace term in approx_path.state_sets,
9                    corresponding to i_term, with new_i_term;
10
11                   new_j_terms = revs_triggered?(new_i_term);
12
13                   put new_j_terms on rev_comps immediately,
14                   and re-sort rev_comps such that the j_term's
15                   continue to be taken in latest time first order;
16
17                   new_fwd_comps =
18                   fwds_triggered?(new_i_term);
19
20                   put new_fwd_comps on fwd_comps
21                   immediately, and re-sort fwd_comps such that
22                   its terms continue to be taken in earliest time
23                   first order;
24           } /* END if new_i_term < i_term */
25   } /* END for each i_term on i_terms */
```

Figure 6G

```
1     for each r_term on r_terms
2     {
3             new_r_term = rev_shrink_2pt3(r_term, j_term);
4             if empty(new_r_term) then return(no_path_exists);
5
6             if new_r_term < r_term then
7             {
8                     replace term in approx_path.input _sets,
9                     corresponding to r_term, with new_r_term;
10
11                    new_j_terms = revs_triggered?(new_r_term);
12
13                    put new_j_terms on rev_comps immediately,
14                    and re-sort rev_comps such that the j_term's
15                    continue to be taken in latest time first order;
16
17                    new_fwd_comps =
18                    fwds_triggered?(new_r_term);
19
20                    put new_fwd_comps on fwd_comps
21                    immediately, and re-sort fwd_comps such that
22                    its terms continue to be taken in earliest time
23                    first order;
24            } /* END if new_r_term < r_term */
25    } /* END for each r_term on r_terms */
```

Figure 6H

```
1    /* do all forward comps, and all addi fwd comps brought up by doing
2    the existing fwd comps, on fwd comp list, where list is sorted such
3    that fwd comps, earliest in time, are done first */
4    for each i_term on fwd_comps
5    {
6            new_i_term = fwd_shrink_2pt1(i_term);
7            if empty(new_i_term) then return(no_path_exists);
8
9            if new_i_term < i_term then
10           {
11                   replace term in approx_path.state_sets, corresponding
12                   to i_term, with new_i_term;
13
14                   new_j_terms = revs_triggered?(new_i_term);
15
16                   put new_j_terms on rev_comps immediately, and re-
17                   sort rev_comps such that the j_term's continue to be
18                   taken in latest time first order;
19
20                   new_fwd_comps = fwds_triggered?(new_i_term);
21
22                   put new_fwd_comps on fwd_comps immediately, and
23                   re-sort fwd_comps such that its terms continue to be
24                   taken in earliest time first order;
25           } /* END if new_i_term < i_term */
26       } /* END for each i_term on fwd_comps */
27
28       } /* END while */
29
30       random_seed = random();
31       spawn_process( max_prio; simulate(approx_path, actual_path,
32       random_seed));
33
34   } /* END bidirectional_approx */
```

Figure 6I

```
1    /* Simulation Process
2    Want to simulate one step from end of actual_path, where end of actual_path is
3    also the only state contained in $P_{0,1}^S, P_{0,2}^S, ... P_{0,n}^S$ of approx_path. */
4    simulate(approx_path, actual_path)
5    {
6
7        /* spawn another simulation process where the random_seed has a
8        different value to ensure a different random vector of inputs to try */
9        spawn_process( local_prio() + lwr_prio, simulate(approx_path,
10       actual_path))
11
12       end_of_path = get_end_of_path( actual_path )
13
14       /* each call to random_valid_input returns a different randomly generated
15       set of inputs which are a member of $P_{0,1}^U, P_{0,2}^U, ... P_{0,m}^U$ */
16       input_vector = random_valid_input(approx_path);
17
18       /* simulate $FSM_{verify}$ for one step, from the time 0 state of approx_path, with
19       the randomly generated set of inputs of input_vector */
20       next_state = one_step_fsm_verify(end_of_path, input_vector);
21
22       new_actual_path = replace the "NULL_input" paired with end_of_path in
23       actual_path with input_vector;
24
25       new_actual_path = concatenate (next_state, NULL_input) pair to end of
26       existing list assigned to new_actual_path;
27
28       if next_state is contained in $E_1^S, E_2^S, ... E_n^S$ then end entire search and return
29       new_actual_path to user as a concrete path from initial state to an error
30       state, otherwise continue;
```

Figure 6J

```
1    if ( (next_state contained in P^S_{1,1}, P^S_{1,2},...P^S_{1,n}) && not(next_state contained in
2    previously_found_states) )
3    {
4            /* add next_state to global hash table, previously_found_states, so
5            that next_state will not be pursued by another process */
6            add_state_to_table(next_state, previously_found_states);
7
8            new_approx_path = only has state_sets for P^S_{0,1}, P^S_{0,2},...P^S_{0,n}, which only
9            contain next_state; only has input_sets P^U_{0,1}, P^U_{0,2},...P^U_{0,m}, which can
10           accept any input combination; and max_time is set to zero;
11
12           spawn_process( local_prio(), forward_approx(new_approx_path,
13           new_actual_path) );
14   }
15
16   } /* END simulate */
17
18
19   /* local_prio () returns priority level of process in which local_prio is being executed
20   */
21   local_prio()
22   {
23           return priority level of process in which local_prio just called
24   }
```

Figure 8A

1 <u>Initial State</u>
2
3 The following values are determined by initializations:
4     actual_path = ( ( $s_{0,1}, s_{0,2}, s_{0,3}$ ) )
5
6     approx_path =
7         state_sets
8             $P_{0,1}^S$
9             $P_{0,2}^S$
10             $P_{0,3}^S$
11         input_sets
12             $P_{0,1}^U$
13             $P_{0,2}^U$
14
15         max_time = 0
16
17 Notes:
18     state_sets accept only initial state $s_{0,1}, s_{0,2}, s_{0,3}$ .
19
20     input_sets accept any input combination
21
22     spawn Forward Approximation, Process ID#1

Figure 8B

1 Forward Approximation: Process ID#1
2
3 The following values are unchanged by forward_approx:
4     actual_path = ( ($s_{0,1}, s_{0,2}, s_{0,3}$) )
5
6     local priority = 1
7
8 The following values are after having been changed by forward_approx:
9     approx_path =
10         state_sets
11             $P_{0,1}^S$    $P_{1,1}^S$
12             $P_{0,2}^S$    $P_{1,2}^S$
13             $P_{0,3}^S$    $P_{1,3}^S$
14         input_sets
15             $P_{0,1}^U$    $P_{1,1}^U$
16             $P_{0,2}^U$    $P_{1,2}^U$
17
18         max_time = 1
19
20 Notes:
21     state_sets of time 1 is an overapproximation of the reachable states
22
23     input_sets at times 0 and 1 accept any input combination
24
25     spawn Forward Approximation, Process ID#2

Figure 8C

1  Forward Approximation: Process ID#2
2
3  The following values are unchanged by forward_approx:
4      actual_path = ( ($s_{0,1}, s_{0,2}, s_{0,3}$) )
5
6      local priority = 2
7
8  The following values are after having been changed by forward_approx:
9      approx_path =
10         state_sets
11             $P_{0,1}^S \quad P_{1,1}^S \quad P_{2,1}^S$
12             $P_{0,2}^S \quad P_{1,2}^S \quad P_{2,2}^S$
13             $P_{0,3}^S \quad P_{1,3}^S \quad P_{2,3}^S$
14         input_sets
15             $P_{0,1}^U \quad P_{1,1}^U \quad P_{2,1}^U$
16             $P_{0,2}^U \quad P_{1,2}^U \quad P_{2,2}^U$
17
18         max_time = 2
19
20  Notes:
21      state_sets of times 0-1 are unchanged; state_sets of time 2 are an
22      overapproximation of the states reachable from the state_sets of time 1.
23
24      input_sets at times 0-2 accept any input combination.
25
26      spawn Forward Approximation, Process ID#3

Figure 8D

1  Forward Approximation: Process ID#3
2
3  The following values are unchanged by forward_approx:
4      actual_path = ( ($s_{0,1}, s_{0,2}, s_{0,3}$) )
5
6      local priority = 3
7
8  The following values are after having been changed by forward_approx:
9      approx_path =
10         state_sets
11             $P_{0,1}^S$   $P_{1,1}^S$   $P_{2,1}^S$   $P_{3,1}^S$
12             $P_{0,2}^S$   $P_{1,2}^S$   $P_{2,2}^S$   $P_{3,2}^S$
13             $P_{0,3}^S$   $P_{1,3}^S$   $P_{2,3}^S$   $P_{3,3}^S$
14         input_sets
15             $P_{0,1}^U$   $P_{1,1}^U$   $P_{2,1}^U$   $P_{3,1}^U$
16             $P_{0,2}^U$   $P_{1,2}^U$   $P_{2,2}^U$   $P_{3,2}^U$
17
18         max_time = 3
19
20  Notes:
21      state_sets of times 0-2 are unchanged; state_sets of time 3 are an
22      overapproximation the states reachable from the state_sets of time 2.
23
24      input_sets at times 0-3 accept any input combination.
25
26      spawn Forward Approximation, Process ID#4 (not shown)
27
28      spawn Bidirectional Approximation, Process ID#5

Figure 8E

```
1   Bidirectional Approximation: Process ID#5
2
3   The following values are unchanged by bidirectional_approx:
4       actual_path = ( ( s_{0,1}, s_{0,2}, s_{0,3} ) )
5
6       local priority = 1
7
8   The following values are after having been changed by bidirectional_approx:
9       approx_path =
10          state_sets
11              P^S_{0,1}    P^S_{1,1}    P^S_{2,1}    P^S_{3,1}
12              P^S_{0,2}    P^S_{1,2}    P^S_{2,2}    P^S_{3,2}
13              P^S_{0,3}    P^S_{1,3}    P^S_{2,3}    P^S_{3,3}
14          input_sets
15              P^U_{0,1}    P^U_{1,1}    P^U_{2,1}    P^U_{3,1}
16              P^U_{0,2}    P^U_{1,2}    P^U_{2,2}    P^U_{3,2}
17
18          max_time = 3
19
20  Notes:
21      state_sets of time 3 are narrowed to their intersection with E^S_1, E^S_2, ... E^S_n.
22
23      state_sets of times 1-2 may be narrowed by forward image or reverse
24      image computations.
25
26      input_sets of times 0-2 may be narrowed by reverse image computations.
27
28      spawn Simulation, Process ID#6
```

Figure 8F

```
1   Simulation: Process ID#6
2
3   proceeds according to the following major steps:
4       begins with following passed parameters and values:
5           local priority = 1
6
7           actual_path = ( ( s_{0,1}, s_{0,2}, s_{0,3} ) )
8
9           approx_path =
10              state_sets
11                  P^S_{0,1}   P^S_{1,1}   P^S_{2,1}   P^S_{3,1}
12                  P^S_{0,2}   P^S_{1,2}   P^S_{2,2}   P^S_{3,2}
13                  P^S_{0,3}   P^S_{1,3}   P^S_{2,3}   P^S_{3,3}
14              input_sets
15                  P^U_{0,1}   P^U_{1,1}   P^U_{2,1}   P^U_{3,1}
16                  P^U_{0,2}   P^U_{1,2}   P^U_{2,2}   P^U_{3,2}
17
18              max_time = 3
19
20      spawn a Simulation, with the old parameters, Process ID#7 (not shown in
21      Figure 8)
22
23      A one step simulation of FSM_{verify} is performed to produce a next_state. A
24      next_state s_{1,1}, s_{1,2}, s_{1,3} is found by using a randomly selected input
25      combination contained in P^U_{0,1}, P^U_{0,2} in combination with s_{0,1}, s_{0,2}, s_{0,3}.
```

Figure 8G

| | |
|---|---|
| 1 | From the parameters passed to simulation, the following new parameters |
| 2 | are determined: |
| 3 | new_actual_path = ( ($s_{0,1}, s_{0,2}, s_{0,3}$), ($s_{1,1}, s_{1,2}, s_{1,3}$) ) |
| 4 | |
| 5 | new_approx_path = |
| 6 |     state_sets |
| 7 |         $P^S_{0,1}$ |
| 8 |         $P^S_{0,2}$ |
| 9 |         $P^S_{0,3}$ |
| 10 |     input_sets |
| 11 |         $P^U_{0,1}$ |
| 12 |         $P^U_{0,2}$ |
| 13 | |
| 14 |     max_time = 0 |
| 15 | |
| 16 | Notes: |
| 17 |     The column of state_sets only contains $s_{1,1}, s_{1,2}, s_{1,3}$. |
| 18 | |
| 19 |     The column of input_sets accepts any input combination. |
| 20 | |
| 21 | spawn a Forward Approximation, with the new parameters, Process ID#8 |

Figure 8H

```
1   Forward Approximation: Process ID#8
2
3   The following values are unchanged by forward_approx:
4       actual_path = ( ($s_{0,1}, s_{0,2}, s_{0,3}$), ($s_{1,1}, s_{1,2}, s_{1,3}$) )
5
6       local priority = 1
7
8   The following values are after having been changed by forward_approx:
9       approx_path =
10          state_sets
11              $P_{0,1}^S$    $P_{1,1}^S$
12              $P_{0,2}^S$    $P_{1,2}^S$
13              $P_{0,3}^S$    $P_{1,3}^S$
14          input_sets
15              $P_{0,1}^U$    $P_{1,1}^U$
16              $P_{0,2}^U$    $P_{1,2}^U$
17
18          max_time = 1
19
20  Notes:
21      spawn Forward Approximation, Process ID#9
```

Figure 8I

```
1    Forward Approximation: Process ID#9
2
3    The following values are unchanged by forward_approx:
4        actual_path = ( ($s_{0,1}, s_{0,2}, s_{0,3}$), ($s_{1,1}, s_{1,2}, s_{1,3}$) )
5
6        local priority = 2
7
8    The following values are after having been changed by forward_approx:
9        approx_path =
10           state_sets
11               $P_{0,1}^S$    $P_{1,1}^S$    $P_{2,1}^S$
12               $P_{0,2}^S$    $P_{1,2}^S$    $P_{2,2}^S$
13               $P_{0,3}^S$    $P_{1,3}^S$    $P_{2,3}^S$
14           input_sets
15               $P_{0,1}^U$    $P_{1,1}^U$    $P_{2,1}^U$
16               $P_{0,2}^U$    $P_{1,2}^U$    $P_{2,2}^U$
17
18           max_time = 2
19
20   Notes:
21       spawn Forward Approximation, Process ID#14 (not shown)
22
23       spawn Bidirectional Approximation, Process ID#12
```

Figure 8J

1 <u>Bidirectional Approximation: Process ID#12</u>
2
3 The following values are unchanged by bidirectional_approx:
4      actual_path = ( $(s_{0,1}, s_{0,2}, s_{0,3})$, $(s_{1,1}, s_{1,2}, s_{1,3})$ )
5
6      local priority = 1
7
8 The following values are after having been changed by bidirectional_approx:
9      approx_path =
10          state_sets
11              $P_{0,1}^S$   $P_{1,1}^S$   $P_{2,1}^S$
12              $P_{0,2}^S$   $P_{1,2}^S$   $P_{2,2}^S$
13              $P_{0,3}^S$   $P_{1,3}^S$   $P_{2,3}^S$
14          input_sets
15              $P_{0,1}^U$   $P_{1,1}^U$   $P_{2,1}^U$
16              $P_{0,2}^U$   $P_{1,2}^U$   $P_{2,2}^U$
17
18          max_time = 2
19
20 Notes:
21      state_sets of time 2 are narrowed to their intersection with $E_1^S, E_2^S, ... E_n^S$.
22
23      state_sets of time 1 may be narrowed by forward image or reverse image
24      computations.
25
26      input_sets of times 0-1 may be narrowed by reverse image computations.
27
28      spawn Simulation, Process ID#13

Figure 8K

1 Simulation: Process ID#13
2
3 proceeds according to the following major steps:
4     begins with following passed parameters and values:
5         local priority = 1
6
7         actual_path = ( $(s_{0,1}, s_{0,2}, s_{0,3})$, $(s_{1,1}, s_{1,2}, s_{1,3})$ )
8
9         approx_path =
10             state_sets
11                 $P_{0,1}^{S}$    $P_{1,1}^{S}$    $P_{2,1}^{S}$
12                 $P_{0,2}^{S}$    $P_{1,2}^{S}$    $P_{2,2}^{S}$
13                 $P_{0,3}^{S}$    $P_{1,3}^{S}$    $P_{2,3}^{S}$
14             input_sets
15                 $P_{0,1}^{U}$    $P_{1,1}^{U}$    $P_{2,1}^{U}$
16                 $P_{0,2}^{U}$    $P_{1,2}^{U}$    $P_{2,2}^{U}$
17
18         max_time = 2
19
20     spawn a Simulation, with the old parameters, Process ID#15 (not shown in
21     Figure 8)
22
23     A one step simulation of $FSM_{verify}$ is performed to produce a next_state. A
24     next state $s_{2,1}, s_{2,2}, s_{2,3}$ is found by using a randomly selected input
25     combination contained in $P_{0,1}^{U}, P_{0,2}^{U}$ in combination with $s_{1,1}, s_{1,2}, s_{1,3}$.

Figure 8L

| | |
|---|---|
| 1 | From the parameters passed to simulation, the following new parameters |
| 2 | are determined: |
| 3 |     new_actual_path = ( $(s_{0,1}, s_{0,2}, s_{0,3})$, $(s_{1,1}, s_{1,2}, s_{1,3})$, $(s_{2,1}, s_{2,2}, s_{2,3})$ ) |
| 4 | |
| 5 |     new_approx_path = |
| 6 |         state_sets |
| 7 |             $P_{0,1}^S$ |
| 8 |             $P_{0,2}^S$ |
| 9 |             $P_{0,3}^S$ |
| 10 |         input_sets |
| 11 |             $P_{0,1}^U$ |
| 12 |             $P_{0,2}^U$ |
| 13 | |
| 14 |     max_time = 0 |
| 15 | |
| 16 |     Notes: |
| 17 |         The column of state_sets only contains $s_{2,1}, s_{2,2}, s_{2,3}$. |
| 18 | |
| 19 |         The column of input_sets accepts any input combination. |
| 20 | |
| 21 | spawn a Forward Approximation, with the new parameters, Process ID#16. |

Figure 8M

1 Forward Approximation: Process ID#16
2
3 The following values are unchanged by forward_approx:
4     actual_path = ( ($s_{0,1}, s_{0,2}, s_{0,3}$), ($s_{1,1}, s_{1,2}, s_{1,3}$), ($s_{2,1}, s_{2,2}, s_{2,3}$) )
5
6     local priority = 1
7
8 The following values are after having been changed by forward_approx:
9     approx_path =
10         state_sets
11             $P_{0,1}^S$    $P_{1,1}^S$
12             $P_{0,2}^S$    $P_{1,2}^S$
13             $P_{0,3}^S$    $P_{1,3}^S$
14         input_sets
15             $P_{0,1}^U$    $P_{1,1}^U$
16             $P_{0,2}^U$    $P_{1,2}^U$
17
18         max_time = 1
19
20 Notes:
21     spawn Bidirectional Approximation, Process ID#17

Figure 8N

1 Bidirectional Approximation: Process ID#17
2
3 The following values are unchanged by bidirectional_approx:
4     actual_path = ( $(s_{0,1}, s_{0,2}, s_{0,3})$, $(s_{1,1}, s_{1,2}, s_{1,3})$, $(s_{2,1}, s_{2,2}, s_{2,3})$ )
5
6     local priority = 1
7
8 The following values are after having been changed by bidirectional_approx:
9     approx_path =
10         state_sets
11             $P_{0,1}^S$    $P_{1,1}^S$
12             $P_{0,2}^S$    $P_{1,2}^S$
13             $P_{0,3}^S$    $P_{1,3}^S$
14         input_sets
15             $P_{0,1}^U$    $P_{1,1}^U$
16             $P_{0,2}^U$    $P_{1,2}^U$
17
18         max_time = 1
19
20 Notes:
21     state_sets of time 1 are narrowed to their intersection with $E_1^S, E_2^S, ... E_n^S$.
22
23     state_sets of time 0 cannot be further narrowed by forward image or
24     reverse image computations.
25
26     input_sets of times 0 may be narrowed by reverse image computations.
27
28     spawn Simulation, Process ID#18

Figure 8O

```
1    Simulation: Process ID#18
2
3    proceeds according to the following major steps:
4         begins with following passed parameters and values:
5              local priority = 1
6
7              actual_path = ( ($s_{0,1}, s_{0,2}, s_{0,3}$), ($s_{1,1}, s_{1,2}, s_{1,3}$), ($s_{2,1}, s_{2,2}, s_{2,3}$) )
8
9              approx_path =
10                  state_sets
11                       $P_{0,1}^S$    $P_{1,1}^S$
12                       $P_{0,2}^S$    $P_{1,2}^S$
13                       $P_{0,3}^S$    $P_{1,3}^S$
14                  input_sets
15                       $P_{0,1}^U$    $P_{1,1}^U$
16                       $P_{0,2}^U$    $P_{1,2}^U$
17
18                  max_time = 1
19
20         spawn a Simulation, with the old parameters (not shown in Figures 7 or 8)
21
22         A one step simulation of $FSM_{verify}$ is performed to produce a next_state. A
23         valid next state $s_{3,1}, s_{3,2}, s_{3,3}$ is found by using a randomly selected input
24         combination contained in $P_{0,1}^U, P_{0,2}^U$ in combination with $s_{2,1}, s_{2,2}, s_{2,3}$.
25
26         Since new end of path $s_{3,1}, s_{3,2}, s_{3,3}$ is in $E_1^S, E_2^S, ... E_n^S$, end search and return
27         as value of new_actual_path: ( ($s_{0,1}, s_{0,2}, s_{0,3}$), ($s_{1,1}, s_{1,2}, s_{1,3}$), ($s_{2,1}, s_{2,2}, s_{2,3}$),
28         ($s_{3,1}, s_{3,2}, s_{3,3}$) ).
```

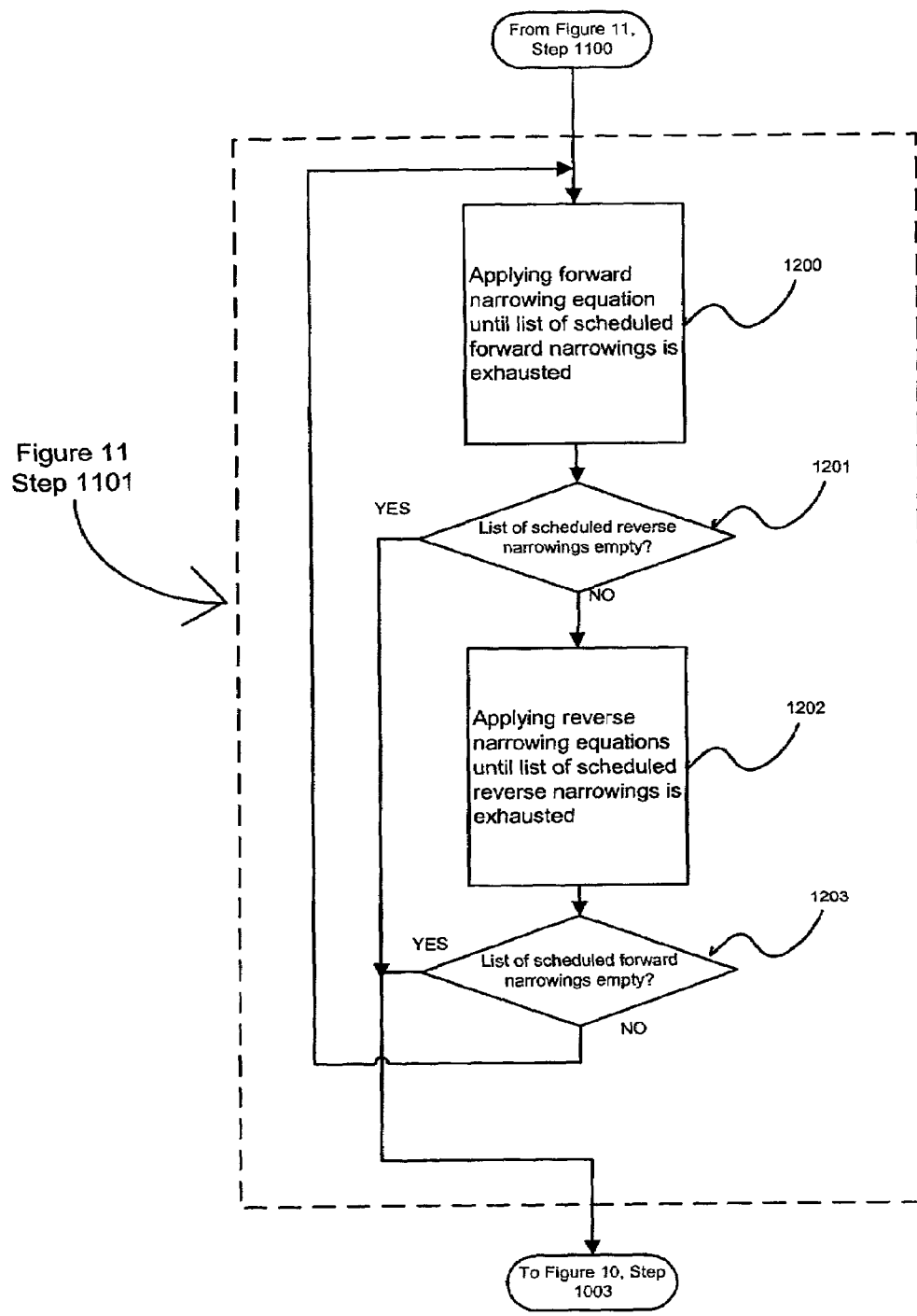

METHOD AND APPARATUS FOR FORMALLY CONSTRAINING RANDOM SIMULATION

As provided for under 35 U.S.C. § 119(e), this patent claims benefit of the filing date for U.S. Provisional Application "Method and Appartus For Formally Constraining Random Simulation," Application No. 60/262,488, filed Jan. 17, 2001. Application No. 60/262,488 is herein incorporated by reference.

FIELD OF THE INVENTION

The present invention relates generally to the functional verification of digital electronic circuits. More specifically, the present invention relates to a form of functional verification which combines random simulation with formal methods.

BACKGROUND OF THE INVENTION

To tackle the increasing complexity of digital electronic circuits, designers need faster and more accurate methods for verifying the functionality of such circuits, particularly in light of ever shrinking product development times.

The complexity of designing such circuits is often handled by expressing the design in a high-level hardware description language (HLHDL), such as Verilog HDL. The detailed syntax and semantics of Verilog HDL is specified in the following publication that is herein incorporated by reference: "IEEE Standard Hardware Description Language Based on the Verilog Hardware Description Language," IEEE Standard 1364-1995, Institute of Electrical and Electronic Engineers, Oct. 1996.

HLHDLs allow the designer to save design time by permitting him or her to express the desired functionality at the register transfer level (RTL) of abstraction or higher. The high-level HDL description is then converted into an actual circuit through a process, well known to those of ordinary skill in the art as "synthesis," involving translation and optimization. An HLHDL description can be verified without translating the HLHDL to a lower-level description.

Verification of the HLHDL description is important since detecting a circuit problem early prevents the expenditure of valuable designer time on achieving an efficient circuit implementation for a design which, at a higher level, will not achieve its intended purpose. Such an HLHDL design, whose correctness is to be determined, shall be referred to as the "design under test" or DUT. In addition, testing of the DUT can be accomplished much more quickly in an HLHDL than after the DUT has been translated into a lower-level, more circuit oriented, description.

HLHDLs describe, directly or indirectly, the two main kinds of circuit entities of an RTL circuit description: i) state devices or sequential logic which store data upon application of a clock signal, and ii) combinational logic. The state devices typically act as either: i) an interface between conceptually distinct circuit systems, or ii) storage for the intermediate or final results of functional evaluation performed by the combinational logic.

Conventionally, such a DUT would be tested by simulating it and applying a test stimulus to the simulation. The test stimulus often consists of multiple "stimulus vectors," each stimulus vector being applied at a succeeding time increment. Each stimulus vector is typically a collection of binary bits, each of which is applied to a corresponding input of the design under test (DUT). The response of the DUT to the test stimulus is collected and analyzed. If the collected response agrees with the expected response then, to some degree of certainty, the DUT is believed by the circuit designer to be expressing the desired functionality. While simulation provides for relatively "deep" penetration of the space of possible states for the DUT (i.e., can transition the DUT through a long sequence of time steps), it often does not provide acceptably broad coverage—i.e., the circuit designer does not know the extent to which the test stimulus has exercised the DUT.

Another approach is the use of exhaustive formal search methods. One application of formal methods involves the definition of a set of erroneous states for the DUT and the determination, by formal methods, as to whether an erroneous state is reachable from an initial state of the DUT. Such methods provide potentially complete (i.e., broad) coverage of the state space of the DUT, but for even moderately complex DUTs the state space is so large that time and resource limits preclude a deep exploration. Therefore, erroneous conditions that require a greater number of state transitions of the DUT before they can be reached will not be identified.

It would therefore be desirable to combine the depth coverage capabilities of simulation with the breadth coverage of formal methods to achieve a verification technique that can more thoroughly test large DUTs.

SUMMARY OF THE INVENTION

A summary of the present invention is presented in connection with FIGS. 10–12. A DUT to be verified is typically translated into a finite state machine referred to as $FSM_{verify}$. A set of goal states, to be searched for their reachability from a start or initial state of $FSM_{verify}$, is defined. FIG. 10, step 1000.

An initial, or start state, from which to search for a goal state, is selected. Step 1001. This start state will form the first state of any sequence of states (called the output sequence of states) that may be output as a complete sequence of states from the start state to a goal state. Step 1001.

An overapproximated path is found from the start state to a goal state. Step 1002. This overapproximated path is represented by a stepping stone matrix, which is created as follows. Note that step 1002 of FIG. 10 is shown in greater detail in FIG. 11.

The present invention selects a partitioning of the state bits and primary inputs (primary inputs henceforth referred to simply as "inputs," unless otherwise noted) of $FSM_{verify}$. A start state is divided according to the partitioning of $FSM_{verify}$. Each start state partition is typically represented by a characteristic function preferrably implemented as a BDD data structure. The next state relation of $FSM_{verify}$ is also partitioned according to the selected partitioning for $FSM_{verify}$ and each transition relation partition is also typically represented as a characteristic function preferrably implemented as a BDD.

Beginning with the partitioned start state, at a time step zero, a forward approximation equation (equation (1) of Section 3.1) is successively applied to produce, for each state set at a time t−1, a corresponding state set at time t. Specifically, in order to produce a state set at a time t for a particular partition (which we shall refer to as "example_2"), the forward approximation equation utilizes the state sets at time t−1 of the fanin to partition example_2 along with the transition relation of example_2. In general, the fanin of a state partition (call it state partition "example_1"), are those state or input partitions which, upon one pass through the next state function of $FSM_{verify}$, can potentially determine the next state of the partition example_1. The forward approximation equation is applied until the state set partitions of a time step comprise at least one goal state, and the resulting matrix is referred to as the state matrix portion of a stepping stone matrix.

In addition to a state matrix, a stepping stone matrix is comprised of a matrix of input sets (the input matrix) typically generated as follows. The primary inputs are partitioned into blocks, with each block being assigned a set of effective input combinations that includes all possible combinations of input values. These input sets are assigned to time step zero. For purposes of initially creating the stepping stone matrix, beginning with time step zero, each input set at a time t−1 is simply duplicated in order to produce a corrresponding input set at time t.

The result is that each matrix of the stepping stone matrix is organized by time-steps along a first dimension (the dimension along which the forward approximation equation or duplication is applied) and by partitions along a second dimension. The state matrix being organized by state partitions along the second dimension while the input matrix is organized by input partitions along the second dimension.

Since the forward approximation equation is creating an overapproximation at each successive time step, the stepping stone matrix represents an overapproximated path from a start state to at least one goal state.

Described thus far is the first part of step 1002 of FIG. 10: the application of a forward approximation equation until a stepping stone matrix is produced. This first part of step 1002 is depicted in FIG. 11 as step 1100. Below is a discussion of the second part of step 1002 which is depitcted in FIG. 11 as step 1101. Step 1101 of FIG. 11 is itself depicted in greater detail in FIG. 12. The steps of FIG. 12 are also referred to below.

Narrowing equations are typically applied to the stepping stone matrix to reduce the amount of overapproximation. There are three narrowing equations, any combination of which may be applied. The three narrowing equations are as follows.

A forward narrowing equation (equation 2.1 of Section 3.2.1.1) narrows a state partition (which we shall refer to as "example_3") at a time step t based upon:

the state and input partitions in the fanin of example_3 at time step t−1; and the transition relation for example_3.

A reverse state narrowing equation (equation 2.2 of Section 3.2.1.2) narrows a state partition (which we shall refer to as "example_4") at a time step t based upon:

a state partition (which we shall refer to as "example_5") in the fanout of example_4 at a time step t+1;

the state and input partitions (other than example_4) in the fanin of example_5 at time step t; and the transition relation for example_5.

The fanout of a state partition example_4 being those state partitions which, upon one pass through the next state function of $FSM_{verify}$, have at least one bit potentially determined by at least bit of example_4.

A reverse input narrowing equation (equation 2.3 of Section 3.2.1.3) narrows an input partition (which we shall refer to as "example_6") at a time step t based upon:

a state partition (which we shall refer to as "example_7") in the fanout of example_6 at a time step t+1;

the state and input partitions (other than example_6) in the fanin of example_7 at time step t; and the transition relation for example_7.

The narrowing equations 2.1–2.3 may be applied to narrow the stepping stone matrix according to any desired procedure. A preferred technique is to apply the narrowing equations in an "event driven" manner. The "event" being the narrowing of a particular state or input set, the consequential potentially productive applications of the narrowing equations are determined. The consequential potentially productive applications are then scheduled for execution, wherein each such execution and may itself produce a further "event" should it result in a narrowed state or input set.

In addition to utilizing an event-driven approach to determine application of the narrowing equations, it may be preferrable to divide the application of the narrowing equations into two phases. The first phase is the performance only of the scheduled forward narrowing equation applications. This is the phase depicted by step 1200 of FIG. 12. The execution of a scheduled forward narrowing may yield an event that results in potentially productive applications of forward narrowings and/or reverse narrowings. Each of the new potentially productive applications is then dynamically added to the appropriate list, either the list of scheduled forward narrowings or the list of scheduled reverse narrowings. The first phase continues until the list of all scheduled forward narrowings has been exhausted. Assuming that the first phase has resulted in at least one scheduled reverse narrowing, the second phase is then started. This test, as to whether the activity of step 1200 has produced scheduled reverse narrowings, is depicted by step 1201 of FIG. 12.

Similar to the first phase, the second phase is the performance only of the scheduled reverse narrowing equation applications. See step 1202, FIG. 12. The execution of a scheduled reverse narrowing may yield an event that results in potentially productive applications of forward narrowings and/or reverse narrowings. Each of the new potentially productive applications is then dynamically added to the appropriate list, either the list of scheduled forward narrowings or the list of scheduled reverse narrowings. The second phase continues until the list of all scheduled reverse narrowings has been exhausted. Assuming that the second phase has resulted in at least one scheduled forward narrowing, the first phase is then started. This test, as to whether the activity of step 1202 has produced scheduled forward narrowings, is depicted by step 1203 of FIG. 12.

During the dynamic addition of potentially productive applications to the list of scheduled forward narrowings or the list of scheduled reverse narrowings, it may be advantageous to keep each of these lists according to a time-step ordering. Specifically, it may be advantageous to order the list of scheduled forward narrowings by increasing time step, while it may be advantageous to order the list of scheduled reverse narrowings by decreasing time step. The net result of such ordering is that during the first phase all state sets at an earlier time step, which can be narrowed, are narrowed before state sets at a later time step are narrowed. Similarly, during the second phase all state or input sets at a later time step, which can be narrowed, are narrowed before state or input sets at an earlier time step are narrowed.

At this point, step 1002 of FIG. 10 has been completed, and the next step is to determine an underapproximated path which lies along the overapproximated path of the stepping stone matrix. Step 1003, FIG. 10. This underapproximation can be accomplished by a variety means, but a typical technique is simulation. A major advantage of the present invention, however, regardless of the underapproximation technique used, is that such underapproximation is constrained by the stepping stone matrix. Typically, only one time-step of simulation is performed, from the start state of the stepping stone matrix at time zero to a state (which we shall refer to as "example_8") contained within the state sets of time-step one.

The "output sequence of states," which will be a sequence of states from the selected initial state of $FSM_{verify}$ to a goal state if the search is successful, is updated with example_8 as the next state in its sequence. FIG. 10, step 1004. In addition, example_8 is identified as a new start state, from which to determine a new stepping stone matrix, should example_8 not complete a path from the selected initial state of $FSM_{verify}$ to a goal state.

A test is then made to determine whether the output sequence of states is indeed a complete path from the selected initial state of $FSM_{verify}$ to a goal state. FIG. 10, step 1005. If such a sequence has been produced, then the procedure is successful and it ends. Otherwise, a loop back to step 1002 is performed where a new stepping stone matrix, using example_8 as the start state, is determined.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 3 illustrates a stepping stone matrix and the next state relations used for its generation;

FIGS. 4A–4K depict the types of state or input set narrowing determinations which are triggered by the narrowing of a state or input set;

FIGS. 5A–5E represent pseudo code for a control structure of bidirectional approximation;

FIGS. 6A–6J represent pseudo code for a higher-level control structure;

FIGS. 8A–8O depicts a portion of the exemplary execution of FIGS. 7A–7B in greater detail;

FIG. 12 represents the the second part, of the two-part process of FIG. 11, in greater detail.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

Table of Contents to Detailed Description

1. Input Format and Overall FSM Verification Goals
2. The FSM For State Space Exploration
3. The Basic Techniques: Forward and Bidirectional Approximation
   3.1 Forward Approximation
   3.2 Bidirectional Approximation
      3.2.1 Narrowing Equations
         3.2.1.1 Forward Narrowing Equation
         3.2.1.2 Reverse State Narrowing Equation
         3.2.1.3 Reverse Input Narrowing Equation
      3.2.2 Triggering of Narrowing Equations: A Taxonomy
         3.2.2.1 SSFD
         3.2.2.2 SSRA
         3.2.2.3 SURA
         3.2.2.4 SSRS
         3.2.2.5 SURS
         3.2.2.6 USFD
         3.2.2.7 USRS
         3.2.2.8 UURS
         3.2.2.9 Additional Considerations
      3.2.3 Bidirectional Approximation Control Strategy
4. Higher-Level Control Structure
   4.1 Overview
   4.2 Pseudo code
   4.3 Example 1. Input Format and Overall FSM Verification Goals The general problem addressed by the present invention is the efficient exploration of large state spaces in finite state machines. The finite state machine explored may be the translation of a DUT expressed in an HLHDL, or may be the result of any other circuit-design process. Certain states of a finite state machine may be considered, by the circuit designer, as "erroneous." The particular question answered by functional verification, in this context, is as follows: given a set of start states and a set of error states, does at least one path exist from a start state to an error state? Alternatively, a set of goal states may be defined which, if reached, indicate that an acceptably broad coverage, of a finite state machine's operation, has been tested. In addition, since the present invention may have use in contexts other than verification, the sought-for "error" states discussed below may have other meanings and, therefore, the invention is more broadly addressed to the problem of finding at least one path from a set of start states to a set of "goal" states.

The present invention typically applies its state space exploration techniques upon an FSM of a particular form and we shall refer to an FSM that is in such a suitable form as $FSM_{verify}$. This section addresses a general format for expressing a circuit design in HLHDL's such that the design can be readily translated into an $FSM_{verify}$. This input format is referred to as an "overall environment." Also discussed in this section is the overall verification goal for an $FSM_{verify}$.

Figure 1:
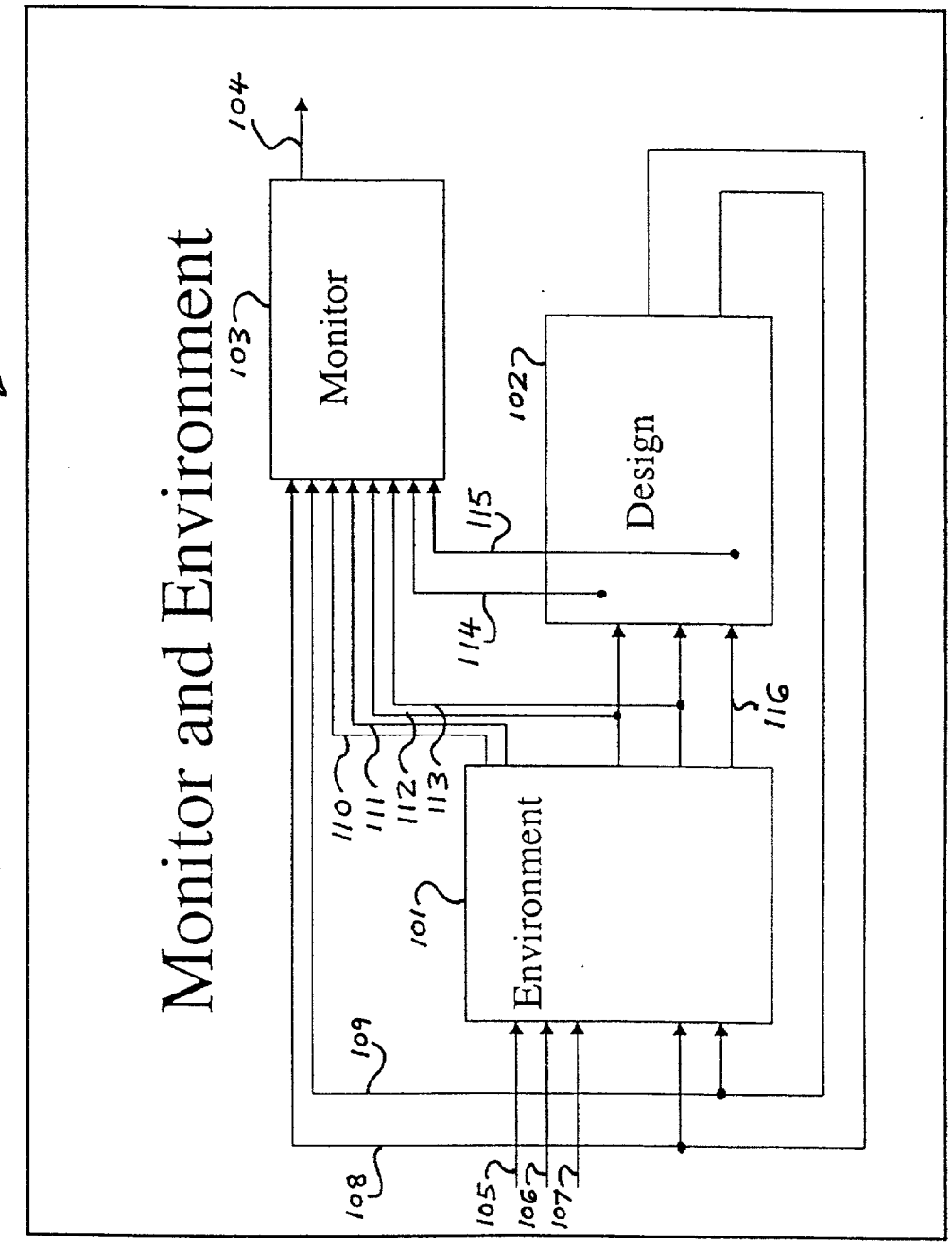
FIG. 1 depicts the overall typical environment in which to apply the present invention for verification purposes.

FIG. 1 depicts an exemplary overall environment 100 for utilizing the present invention. Design 102 is the circuit design whose functionality is to be verified. Environment 101 and Monitor 103 are circuit designs specifically designed for testing Design 102.

Typically, Design 102 is specified in a high-level hardware description language (HLHDL) such as IEEE Standard 1076-1993 VHDL or IEEE Standard 1364-1995 Verilog HDL. Monitor 103 and Environment 101 are preferably specified in a language which is easily synthesizable into a register transfer level (RTL) description. A suitable example would be a subset of a simulation-oriented Hardware Verification Language (HVL), such as the Vera Verification System language from Synopsys, Inc., Mountain View, Calif., U.S.A.

Design 102, Monitor 103 and Environment 101 are all synthesized into a single finite state machine for verification ($FSM_{verify}$), in an RTL description, which is comprised of register bits and combinational logic.

More specifically, environment 101, design 102 and monitor 103 are typically designed to function together as follows such that an $FSM_{verify}$ is produced when they are all synthesized into a single FSM.

Environment 101 is capable of generating all valid (or "legal") input combinations of Design 102, while Monitor 103 is capable of recognizing whenever Design 102 moves into an erroneous state. As can be seen in FIG. 1, Design 102 is shown as having three inputs (connected to nodes 112, 113 and 116) and two outputs (connected to nodes 108–109). Environment 101 generates legal combinations of inputs for Design 102 and also may effect the monitoring, by Monitor 103, by driving four inputs of Monitor 103 (those four inputs connected to nodes 110–113). The outputs generated by Environment 101 are controlled by its inputs (connected to nodes 105–109). As shown by the connections for nodes 108–109, there may be a feedback loop with the outputs of Design 102 being connected to inputs of Environment 101. Environment 101 is typically controlled by inputs of the type of the three connected to nodes 105–107 (as well as by feedback from Design 102 via nodes 108–109). Any combination may be applied to inputs 105–107 of Environment 101 and, in response, Environment 101 is capable of generating all legal inputs, and only legal inputs, for Design 102. Monitor 103 monitors the state of Design 102, as it is being driven through test sequences by Environment 101, and it stays in a state or states which set its single output bit 104 to a "low" state so long as Design 102 is not in an erroneous state. When Monitor 103 detects Design 102 as entering an error state (or an erroneous sequence of states), it then enters a state or states which set the single output bit 104 to a "high" value. Monitor 103 monitors the state of Design 102 by monitoring internal nodes (such as those connected to nodes 114–115) as well as monitoring outputs (such as those connected to nodes 108–109). The Monitor 103 can also evaluate Design 102's performance based upon the outputs of Environment 101 (such as nodes 110–113).

Design 102, Monitor 103 and Environment 101 are also designed such that they may be "reset" into an initial state or states.

Given the above description of an overall environment, and the capabilities this overall environment implies for the $FSM_{verify}$ synthesized from it, the verification goal of the present invention can be stated as follows. From the initial state or states which $FSM_{verify}$ may be reset to, $FSM_{verify}$ may be "steered" to a variety of states based upon values applied to its primary inputs, which primary inputs correspond to the inputs of Environment 101. The objective of the present invention is to determine whether a path can be found from an initial state to a state in which the single output bit 104 of $FSM_{verify}$ rises to a high value.

2. The FSM for State Space Exploration

This section describes general data structures for $FSM_{verify}$. These data structure are then operated upon, by the procedures of the following sections, in order to perform state space exploration in accordance with the present invention.

Figure 2:
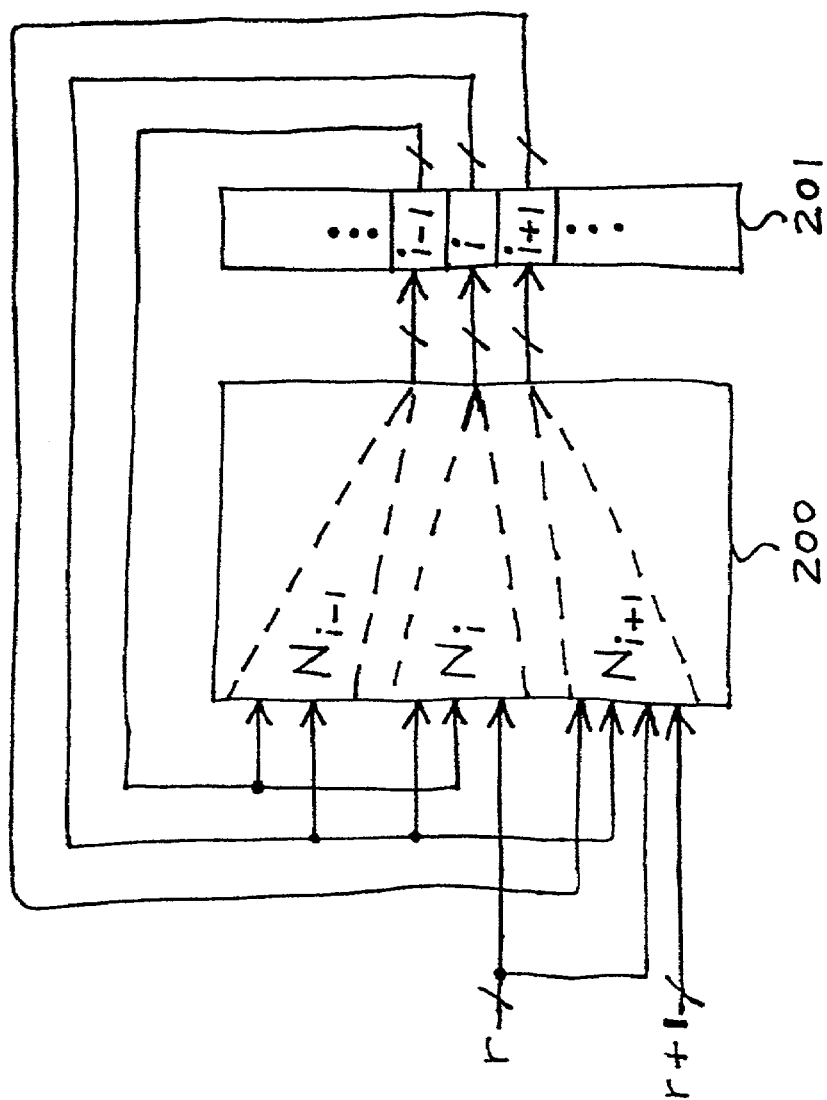
FIG. 2 represents a state machine into which the circuitry of FIG. 1 is converted.

A general representation of $FSM_{verify}$ is shown in FIG. 2. As with any finite state machine, it is composed of a combinational portion 200 and a register portion 201. Combinational portion 200 accepts two types of inputs: the current state from register 201 and primary inputs.

The register bits are divided into n state partitions (where $n \geq 1$) containing, typically, no more than 30 bits each. FIG. 2 shows an example containing at least three state partitions i−1, i, and i+1, where i is an arbitrary state partition and $1 \leq i \leq n$. The state of each of these n state partitions, at a time t, are represented as $s_{t,1}, s_{t,2} \ldots s_{t,n}$. A time t is a number of cycles of $FSM_{verify}$ from a state defined as time 0.

The effectiveness of the present invention is increased to the extent that the partitions, with respect to each other, are uncorrelated. Two partitions are uncorrelated to the extent that the state of one partition cannot be determined from the state of the other partition. According to the present embodiment register bits are assigned to a partition according to the algorithm described in "Automatic State Space Decomposition for Approximate FSM Traversal Based on Circuit Analysis," by Hyunwoo Cho, Gary D. Hachtel, Enrico Macii, Massimo Poncino and Fabio Somenzi, IEEE Trans. on Computer-Aided Design of Integrated Circuits and Systems, Vol. 15, No. 12, December 1996, pages 1451–1464, which is herein incorporated by reference. This algorithm tends to place two register bits into the same partition: (i) if their current values directly influence each other's next values, and (ii) if their next values are largely determined by the same primary inputs and current register bits.

The primary inputs of $FSM_{verify}$ are divided into m partitions containing, typically, no more than 30 bits of inputs each. FIG. 2 depicts an example with at least two input partitions r and r+1, where r is an arbitrary input partition and $1 \leq r \leq m$. The values of each of these m input partitions, at a time t, are represented as $u_{t,1}, u_{t,2} \ldots u_{t,m}$. A time t is a number of cycles of $FSM_{verify}$ from a state defined as time 0.

Each state partition i of $FSM_{verify}$ is driven by a "cone of logic" which is defined as follows. A partition i of register 201 has its inputs driven by certain outputs of combinational logic 200. The transitive fanin of these outputs is the cone of logic for the state partition i. This transitive fanin is just through combinational logic 200, and ends upon reaching either a primary input or a register 201 output. This cone of logic is the next state function for partition i. Inputs to this cone of logic for a state partition i will henceforth simply be referred to as the "fanin of partition i." A next state function of a partition i accepts as input the states of its state partition fanin at time t−1, as well as the inputs applied to its input partition fanin at time t−1, and returns a next state for partition i at time t. For example, the next state functions N for each state partition shown in FIG. 2 are: $N_{i-1}(s_{t-1,i-1}, s_{t-1,i})$, $N_i(s_{t-1,i-1}, s_{t-1,i}, u_{t-1,r})$ and $N_i(s_{t-1,i}, s_{t-1,i+1}, u_{t-1,r}, u_{t-1,r+1})$.

The below description utilizes the terms "characteristic function" and "BDD's" according to their generally known meaning. For convenience, these terms are also defined herein as follows.

A characteristic function represents set membership with a function that returns a "1" if the function's argument is an element of the set and returns a "0" otherwise. Characteristic functions are, unless noted otherwise, preferably implemented according to a "binary decision diagram" or BDD representation.

BDDs are well known in the art as a kind of directed acyclic graph (DAG) for representing logic functions. A BDD comprises a root node, intermediate nodes and two leaf nodes (although a BDD of just one variable would not have any intermediate nodes). One of the leaf nodes represents a logic "1" output of the logic function represented, while the other leaf node represents a logic "0" output. Each non-leaf node is labeled by a variable of the logic function, and therefore each non-leaf node has two children: one child for when the parent node's variable has value "1" and the other child node for when the parent node's variable has value "0." Comprehensive and detailed discussion of BDD's may be found in such references as "Binary Decision Diagrams: Theory and Implementation," by Rolf Drechsler and Bernd Becker, Kluwer Academic Publishers, 1998.

Assume a state partition i has a cone fo logic with a fanin of q state partitions and p input partitions. The natural number denoting each of the state partitions of the fanin are represented as $a_1, a_2, \ldots a_q$. The natural number denoting each of the input partitions of the fanin are represented as $b_1, b_2, \ldots b_p$.

A characteristic function $T_i$, of the next state function of a state partition i, is determined for each state partition. We shall refer to $T_i$ as $T_i$ ($s_{t-1,a_1}, s_{t-1,a_2}, \ldots s_{t-1,a_q}, u_{t-1,b_1}, u_{t-1,b_2}, \ldots u_{t-1,b_p}, s_{t,i}$), where: $s_{t-1,a_1}, s_{t-1,a_2}, \ldots s_{t-1,a_q}$ is the set of states, at time t−1, of each state partition of the fanin of state partition i; $u_{t-1,b_1}, u_{t-1,b_2}, \ldots u_{t-1,b_p}$ is the set of inputs, at time t−1, for each input partition of the fanin of state partition i; and $s_{t,i}$ is the state which partition i will transition into at time t as a result of $s_{t-1,a_1}, s_{t-1,a_2}, \ldots s_{t-1,a_q}$ and $u_{t-1,b_1}, u_{t-1,b_2}, \ldots u_{t-1,b_p}$.

For efficiency reasons, $T_i$ is preferably not represented as a single large BDD. Rather, $T_i$ is broken up in two main ways.

First, the characteristic sub-function $T_{i,p\_bit}$ is determined for each bit, p_bit, of partition i. Each function $T_{i,p\_bit}$ is converted into a BDD and the complete $T_i$ is represented by the AND of these BDDs.

Second, auxiliary variables are introduced to represent intermediate results in the computation of the sub-functions, and each sub-function is then represented by sub—sub-functions written in terms of these auxiliary variables. BDDs are created for each sub—sub-function, and the AND of these sub—sub-function BDDs represents a sub-function $T_{i,p\_bit}$. The characteristic function for $T_i$ is found by existentially quantifying out all the auxiliary variables introduced by this form of representing each $T_{i,p\_bit}$.

For further efficiency reasons, the following techniques should also be considered for the equations presented in the next section below (equation (1) and equations (2.1)–(2.3)) which utilize $T_i$. These below equations involve additional existential quantifications and AND operations (AND operations also being known as "conjunctions" or "intersections"). It is generally most efficient to do some of this existential quantification and some of these AND operations among the BDDs representing the sub—sub-functions until these BDDs are several hundred nodes in size. Further existential quantification and ANDings, to produce $T_i$, are then best interleaved with the existential quantifications and ANDings comprising the equations in which $T_i$ is used.

Compared with known techniques for formal verification, the present invention utilizes a finer level of state set partitioning (discussed further below) which encourages this efficient interleaving of the determination of $T_i$ with the equations in which $T_i$ is utilized.

In general, we shall refer to a characteristic function representing at least all the states reachable by a state partition i at a time t as $P_{t,i}^S(s_{t,i})$, where: the superscript "S" means that "P" is the characteristic function for a set of states; the subscript "t,i" means that P represents a set of states for partition i at a time t; and $s_{t,i}$ is a potential state of partition i at time t if $P_{t,i}^S(s_{t,i})$ returns a "1."

In general, we shall refer to a characteristic function representing at least all the effective input combinations which may be applied to an input partition r at a time t as $P_{t,r}^U(u_{t,r})$, where: the superscript "U" means that "P" is the characteristic function for a set of input combinations; the subscript "t,r" means that P represents a set of input combinations for partition r at a time t; and $u_{t,r}$ is a potentially effective input combination applicable to input partition r at time t if $P_{t,r}^U(u_{t,r})$ returns a "1."

A characteristic function is determined for each state partition for its portion of the total initial state of $FSM_{verify}$. In accordance with the above-described notation, these initial state functions are $P_{0,1}^S, P_{0,2}^S, \ldots P_{0,n}^S$, where the initial state is at t=0. In general, an $FSM_{verify}$ may have more than one initial state, in which case the characteristic functions for each partition would each represent its portion of more than one state. In the following discussion, however, only a single initial state is selected for each search to be performed.

A characteristic function is determined for each input partition that contains at least all of the effective input combinations which may be applied to that input partition while $FSM_{verify}$ is in the initial state. These initial input combination functions are $P_{0,1}^U, P_{0,2}^U, \ldots P_{0,m}^U$. These criteria are satisfied by creating characteristic functions that indicate all input combinations are effective.

Finally, as part of the initial set of characteristic functions to be determined, characteristic functions are found for the state or states of $FSM_{verify}$ which indicate that Monitor 103 has detected an erroneous state of Design 102. A characteristic function of the erroneous states of a partition i is represented as $E_i^S(s_i)$, where: the superscript "S" means that "E" is the characteristic function for a set of states; and $s_i$ is a state of partition i. More specifically, a complete set of characteristic functions for describing certain error states, which we shall refer to as a "complete error set," are represented as $E_1^S, E_2^S, \ldots E_n^S$. The error states for an $FSM_{verify}$ are typically described by several such complete error sets. Such complete error sets are determined as follows.

A BDD describing, in a non-partitioned way, all the error states of $FSM_{verify}$ is first determined as follows. The output of combinational portion 200, driving output bit 104, is identified. The transitive fanin of this output is traced back through combinational portion 200 until either a primary input or an output of register 201 is encountered. A BDD representing this function, called $E_{total}^S$, is generated. Any primary inputs upon which this BDD depends are existentially quantified out producing a BDD $E_{total-pri\_inputs}^S$. Starting at the root node of $E_{total-pri\_inputs}^S$, all paths though this BDD, which lead to the "1" leaf node, are generated. We shall refer to each of these paths as an "error BDD path" and we shall refer to the number of error BDD paths produced, for a particular $FSM_{verify}$, as num_error_paths. Each of these error BDD paths is converted into a complete error set as follows.

An error BDD path will require a certain subset of the total state bits of register 201 to have certain values, while the remaining state bits can take any value (are "don't cares"). For each partition i of the state bits, if the error BDD path places no constraints on any of its bits, then the characteristic function representing this error BDD path for this partition, which we represent as $E_i^S$, should accept any combination of values. Otherwise, the error BDD path places constraints on some or all of the bits of each partition i, and the $E_i^S$ generated should accept all combinations of values which satisfy those constraints.

The total set of complete error sets, produced by the above procedure, can represented as: $((E_1^S, E_2^S, \ldots E_n^S)_1, (E_1^S, E_2^S, \ldots E_n^S)_2, \ldots (E_1^S, E_2^S, \ldots E_n^S)_{num\_error\_paths})$. While num_error_paths of complete error sets are thereby generated, in the following discussion we will address the simplified case where there is only one complete error set. The only change required for the following discussion, when handling multiple complete error sets, is that a path being explored is completed when it reaches any one of these complete error sets.

Note that finding the complete error sets from $E_{total-pri\_inputs}^S$, rather than $E_{total}^S$ means that a path found to an error state, by the present invention, may in fact require an additional combination of primary inputs in order to make this last state produce the error. This combination of primary inputs is readily ascertainable, given that the path sequence to the error state has already been provided by the present invention, utilizing well-known techniques for finding inputs to satisfy a Boolean equation.

3. The Basic Techniques: Forward and Bidirectional Approximation

Finding a path from an initial state $s_{0,1}, s_{0,2} \ldots s_{0,n}$ to a final state $s_{f,1}, s_{f,2} \ldots s_{f,n}$ at some time f, where the intersection between $s_{f,1}, s_{f,2} \ldots s_{f,n}$ and $E_1^S, E_2^S \ldots E_n^S$ is non-null for every state partition, involves the two following more basic techniques which we shall call "forward approximation" and "bidirectional approximation." These two more basic techniques are as follows.

3.1 Forward Approximation

Figure 3:
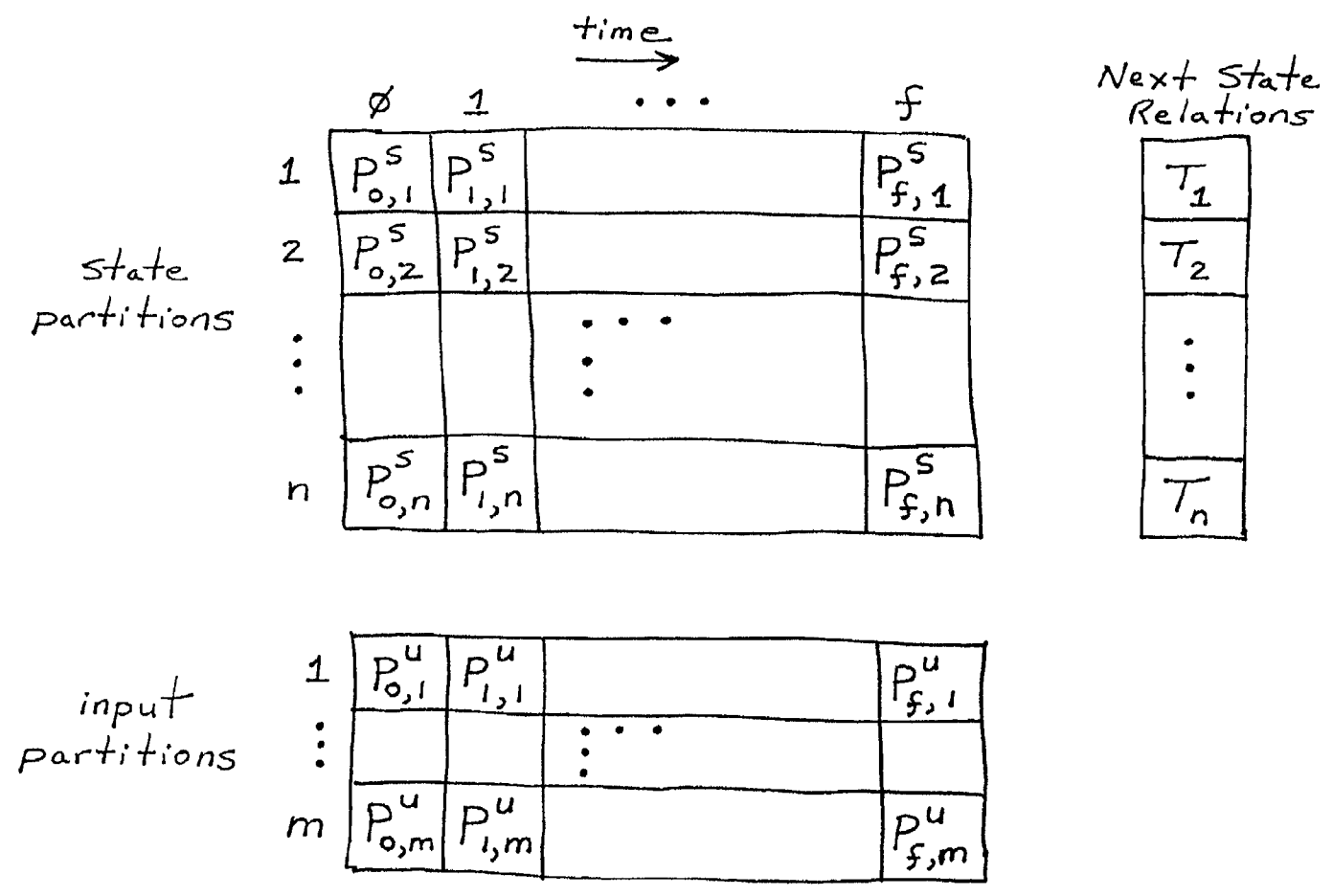

The forward approximation technique determines for each state partition i, an overapproximate set of the states it can reach at a time t based upon the overapproximate set of states $FSM_{verify}$ can reach at time t−1 in conjunction with $T_i$. This technique is used to determine a matrix of characteristic functions as shown in FIG. 3 (which we shall refer to as a "stepping stone matrix"). Starting with $P_{0,1}^S, P_{0,2}^S, \ldots P_{0,n}^S$ and $P_{0,1}^U, P_{0,2}^U, \ldots P_{0,m}^U$, the succeeding time periods of the matrix are determined until, at a time f, the intersection between every $P_{f,1}^S, P_{f,2}^S, \ldots P_{f,n}^S$ and its corresponding $E_1^S, E_2^S, \ldots E_n^S$ is non-null. In accordance with applying this first basic technique to produce the matrix of FIG. 3, each set of characteristic functions $P_{t,1}^U, P_{t,2}^U, \ldots P_{t,m}^U$ for any time t is simply a duplicate of the corresponding function of $P_{0,1}^U, P_{0,2}^U, \ldots P_{0,m}^U$ for time 0. This is due to the fact that this first basic technique does not constrain the permissible input combinations in generating the reachable states.

The forward approximation technique is accomplished with equation (1) below:

$$P_{t,i}^S(s_{t,i}) = \exists s_{t-1,a_1} \exists s_{t-1,a_2} \ldots \exists s_{t-1,a_q} \exists u_{t-1,b_1} \exists u_{t-1,b_2} \ldots \exists u_{t-1,b_p} [P_{t-1,a_1}^S(s_{t-1,a_1}) \wedge P_{t-1,a_2}^S(s_{t-1,a_2}) \wedge \ldots P_{t-1,a_q}^S(s_{t-1,a_q}) \wedge T_i(s_{t-1,a_1}, s_{t-1,a_2}, \ldots s_{t-1,a_q}, u_{t-1,b_1}, u_{t-1,b_2}, \ldots u_{t-1,b_p}, s_{t,i})] \quad (1)$$

A function $P_{t,i}^S(s_{t,i})$ is determined by combining the already-known functions on the right-hand-side of equation (1). As discussed above, the functions on the right-hand-side of equation (1) have been expressed as BDDs. It is known in the art how to combine such BDD functions according to the operators (of existential quantification and conjunction) of-the-right-hand-side of equation in order to produce a new BDD representing the function of the left-hand-side of the equation. The exact computation of the BDD representing $P_{t,i}^S(s_{t,i})$ according to equation (1) can become intractable for certain functions. In such cases an over approximation of $P_{t,i}^S(s_{t,i})$ can be found using known techniques.

Once a matrix of the type shown in FIG. 3 has been determined, the second technique of bidirectional approximation is used to narrow its overapproximate sets. Narrowing the overapproximate sets makes it easier for a simulator to find an actual path, if one exists, from the initial state of $FSM_{verify}$ to a state $s_{f,1}, s_{f,2} \ldots s_{f,n}$.

3.2 Bidirectional Approximation

The second basic technique of bidirectional approximation is presented below in three main parts: a discussion of the three equations by which narrowed sets of the stepping stone matrix can be computed; a taxonomic discussion of which of the three equations are "triggered" by the narrowing (or shrinking) of a particular set; and a discussion of a control strategy for efficiently applying the three equations to achieve a maximal shrinking of a particular stepping stone matrix.

3.2.1 Narrowing Equations 3.2.1.1 Forward Narrowing Equation

The first of the three narrowing equations is one for shrinking a set of states at a time t, based upon the reachable states and applicable input combinations at time t−1, which we shall call "forward narrowing." Forward narrowing is accomplished by the following equation (2.1):

$$P_{t,i}^S(s_{t,i}) = \quad (2.1)$$
$$P_{t,i}^S(s_{t,i}) \wedge$$
$$\exists s_{t-1,a_1}, s_{t-1,a_2}, \ldots s_{t-1,a_q}$$
$$\exists u_{t-1,b_1}, u_{t-1,b_2}, \ldots u_{t-1,b_p}$$
$$\begin{bmatrix} P_{t-1,a_1}^S(s_{t-1,a_1}) \wedge P_{t-1,a_2}^S(s_{t-1,a_2}) \wedge \ldots P_{t-1,a_q}^S(s_{t-1,a_q}) \\ \wedge \\ P_{t-1,b_1}^U(u_{t-1,b_1}) \wedge P_{t-1,b_2}^U(u_{t-1,b_2}) \wedge \ldots P_{t-1,b_p}^U(u_{t-1,b_p}) \\ \wedge \\ T_i(s_{t-1,a_1}, s_{t-1,a_2}, \ldots s_{t-1,a_q}, u_{t-1,b_1}, u_{t-1,b_2}, \ldots u_{t-1,b_p}, s_{t,i}) \end{bmatrix}$$

As with equation (1), a new function $P_{t,i}^S(s_{t,i})$ on the left-hand-side is determined by combining the already-known functions on the right-hand-side of equation (2.1). The functions on the right-hand-side of equation (2.1) have been expressed as BDDs and it is known in the art how to combine such BDD functions according to the operators of the-right-hand-side of equation (2.1). As with equation (1), the exact computation of the BDD representing $P_{t,i}^S(s_{t,i})$ according to equation (2.1) can become intractable for certain functions. In such cases an over approximation of $P_{t,i}^S(s_{t,i})$ can be found using known techniques.

Equation (2.1) is called forward narrowing since its purpose, with respect to a transition from a time t−1 to a time t, is to narrow the set transitioned to at time t.

3.2.1.2 Reverse State Narrowing Equation

The second of the three narrowing equations, which we shall call "reverse state narrowing," is one for shrinking a set of states at a time t, based upon the set of states it can reach at a time t+1, when the set at time t is considered in conjunction with other reachable states and applicable input combinations at time t. Reverse state narrowing is accomplished by the following equation (2.2):

$$P_{t,i}^{S}(s_{t,i}) = \begin{bmatrix} P_{t,i}^{S}(s_{t,i}) \wedge \\ \exists s_{t+1,j} \\ \exists s_{t,c_1}, s_{t,c_2}, \ldots s_{t,c_{k-1}} \\ \exists u_{t,d_1}, u_{t,d_2}, \ldots u_{t,d_l} \\ \begin{bmatrix} P_{t+1,j}^{S}(s_{t+1,j}) \\ \wedge \\ P_{t,c_1}^{S}(s_{t,c_1}) \wedge P_{t,c_2}^{S}(s_{t,c_2}) \wedge \ldots P_{t,c_{k-1}}^{S}(s_{t,c_{k-1}}) \\ \wedge \\ P_{t,d_1}^{U}(u_{t,d_1}) \wedge P_{t,d_2}^{U}(u_{t,d_2}) \wedge \ldots P_{t,d_l}^{U}(u_{t,d_l}) \\ \wedge \\ T_j(s_{t,c_1}, s_{t,c_2}, \ldots s_{t,c_{k-1}}, s_{t,i}, u_{t,d_1}, u_{t,d_2}, \ldots u_{t,d_l}, s_{t+1,j}) \end{bmatrix} \end{bmatrix}$$ (2.2)

Where:

the fanout of a state partition i, referring to FIG. 2, is found by tracing (in a transitive manner) from the register 201 outputs of partition i through combinational logic 200 until inputs to register 201 are reached; each partition of register 201, which has at least one of its inputs reached, is in the fanout of partition i;

j is any state partition in the fanout of partition i, and $1 \leq j \leq n$;

k is the fanin, in terms of a number of state partitions, of a state partition j;

$c_1, c_2, \ldots c_k$ each represent all of the state partitions of the non-transitive fanin for state partition j $c_1, c_2, \ldots c_{k-1}$ each represent a state partition of the non-transitive fanin for state partition j, other than the state partition i;

l is the fanin, in terms of a number of input partitions, of state partition j; and $d_1, d_2, \ldots d_l$ each represent an input partition of the fanin for state partition j.

As with equation (2.1), a new function $P_{t,i}^{S}(s_{t,i})$ on the left-hand-side is determined by combining the already-known functions on the right-hand-side of equation (2.2). As with equations (1) and (2.1), the exact computation of the BDD representing $P_{t,i}^{S}(s_{t,i})$ according to equation (2.1) can become intractable for certain functions. In such cases an over approximation of $P_{t,i}^{S}(s_{t,i})$ can be found using known techniques.

Equation (2.2) is called reverse state narrowing since its purpose, with respect to a transition from a time t to a time t+1, is to narrow a state set transitioned from at time t.

3.2.1.3 Reverse Input Narrowing Equation

The third of the three narrowing equations, which we shall call "reverse input narrowing," is for shrinking a set of permissible inputs at a time t, based upon the set of states it can reach at a time t+1, when the set at time t is considered in conjunction with other reachable states and applicable input combinations at time t. Reverse input narrowing is accomplished by the following equation (2.3):

$$P_{t,r}^{U}(u_{t,r}) = \begin{bmatrix} P_{t,r}^{U}(u_{t,r}) \wedge \\ \exists s_{t+1,j} \\ \exists s_{t,c_1}, s_{t,c_2}, \ldots s_{t,c_k} \\ \exists u_{t,d_1}, u_{t,d_2}, \ldots u_{t,d_{l-1}} \\ \begin{bmatrix} P_{t+1,j}^{S}(s_{t+1,j}) \\ \wedge \\ P_{t,c_1}^{S}(s_{t,c_1}) \wedge P_{t,c_2}^{S}(s_{t,c_2}) \wedge \ldots P_{t,c_{k-1}}^{S}(s_{t,c_k}) \\ \wedge \\ P_{t,d_1}^{U}(u_{t,d_1}) \wedge P_{t,d_2}^{U}(u_{t,d_2}) \wedge \ldots P_{t,d_l}^{U}(u_{t,d_{l-1}}) \\ \wedge \\ T_j(s_{t,c_1}, s_{t,c_2}, \ldots u_{t,r}, u_{t,d_1}, u_{t,d_2}, \ldots u_{t,d_{l-1}}, s_{t+1,j}) \end{bmatrix} \end{bmatrix}$$ (2.3)

Where:

the fanout of an input partition r, referring to FIG. 2, is found by tracing (in a transitive manner) from primary inputs r through combinational logic 200 until inputs to register 201 are reached; each partition of register 201, which has at least one of its inputs reached, is in the fanout of partition input r;

j is slightly redefined, from its meaning in equation 2.2, to be any state partition in the fanout of partition r, and $1 \leq j \leq n$;

$d_1, d_2, \ldots d_{l-1}$ each represent an input partition of the fanin for state partition j, other than input partition r.

As with equation (2.2), a new function $P_{t,r}^{U}(s_{t,r})$ on the left-hand-side is determined by combining the already-known functions on the right-hand-side of equation (2.3). As with equations (1), (2.1) and (2.2), the exact computation of the BDD representing $P_{t,r}^{U}(s_{t,r})$ according to equation (2.3) can become intractable for certain functions. In such cases an over approximation of $P_{t,r}^{U}(s_{t,r})$ can be found using known techniques.

Equation (2.3) is called reverse input narrowing since its purpose, with respect to a transition from a time t to a time t+1, is to narrow an input set transitioned from at time t.

3.2.2 Triggering of Narrowing Equations: a Taxonomy

Equations (2.1)–(2.3) indicate that if a particular set $P_{t,i}^{S}$ of a particular stepping stone matrix $SSM_1$ has already been shrunken (which we shall refer to as the "trigger set"), then certain other sets of $SSM_1$ should be recalculated to determine whether they are shrunken as a result. Likewise, equations (2.1)–(2.3) indicate that if $P_{t,r}^{U}$ is the trigger set of a particular stepping stone matrix $SSM_1$, then certain other sets of $SSM_1$ should be recalculated to determine whether they are shrunken as a result. The rules for determining, in general, which other sets of $SSM_1$ to recalculate, are as follows. These rules are merely necessary implications of equations (2.1)–(2.3) stated in explicit form. The rules are illustrated by the example of FIGS. 4A–4K, which are based upon the fanin and fanout of FIG. 2.

The rules are organized according to the following four variable taxonomy, where each variable is defined as follows:

the first variable takes a value from the set {S,U}, and indicates whether the trigger set is of type "S" or "U" in its superscript;

the second variable takes a value from the set {S,U}, and indicates whether the type of set to be recalculated, as a result of the trigger set having narrowed, is of type "S" or "U" in its superscript;

the third variable takes a value from the set {F,R}, and indicates whether the set is being recalculated by forward narrowing or reverse narrowing (of either a state or input set); and the fourth variable takes a value from the set {A,S,D}, and indicates whether the set being recalculated is, in relative time position to the trigger set, an ancestor, sibling or descendent.

Figure 4A:
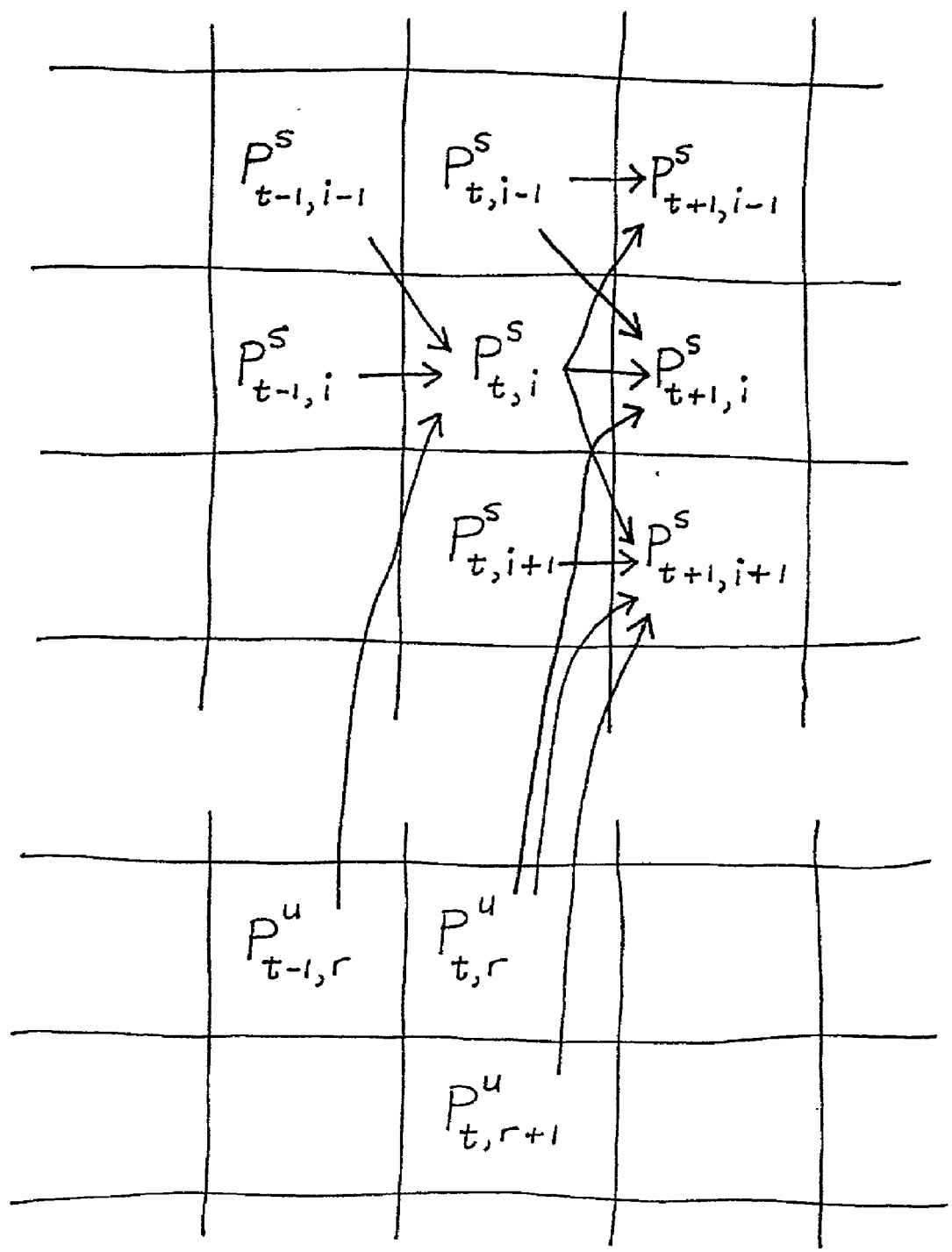

FIG. 4A depicts a fragment of a stepping stone matrix with the sets shown having fanins and fanouts in accordance with the wiring of FIG. 2.

Figure 4B:
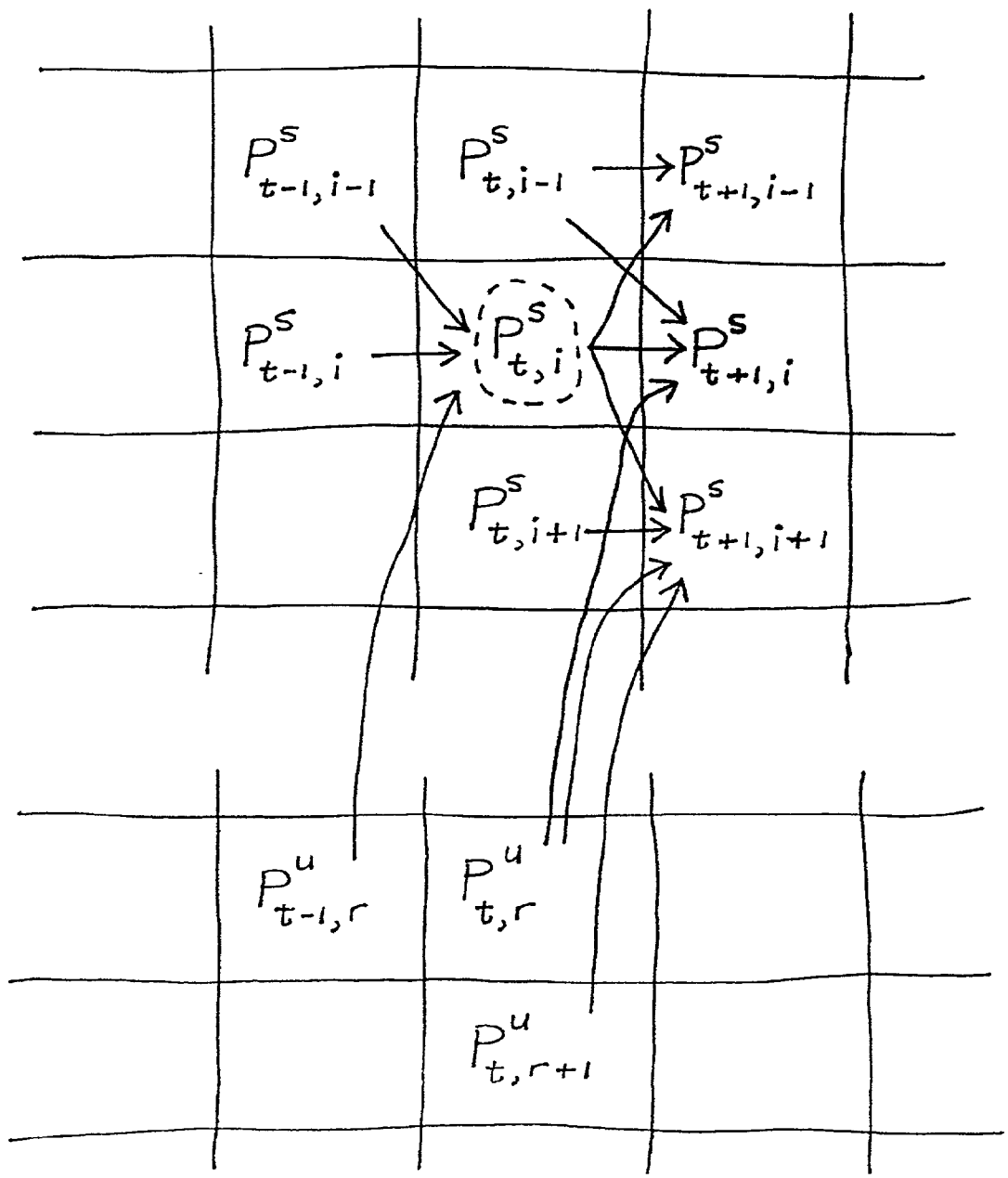

FIG. 4B depicts the fact that a particular set of the stepping stone matrix fragment, namely set $P_{t,i}^S$, has been caused to be shrunk by some higher-level control procedure to be presented below. The fact that $P_{t,i}^S$ has been shrunk is indicated by its dashed encirclement.

3.2.2.1 SSFD

Figure 4C:
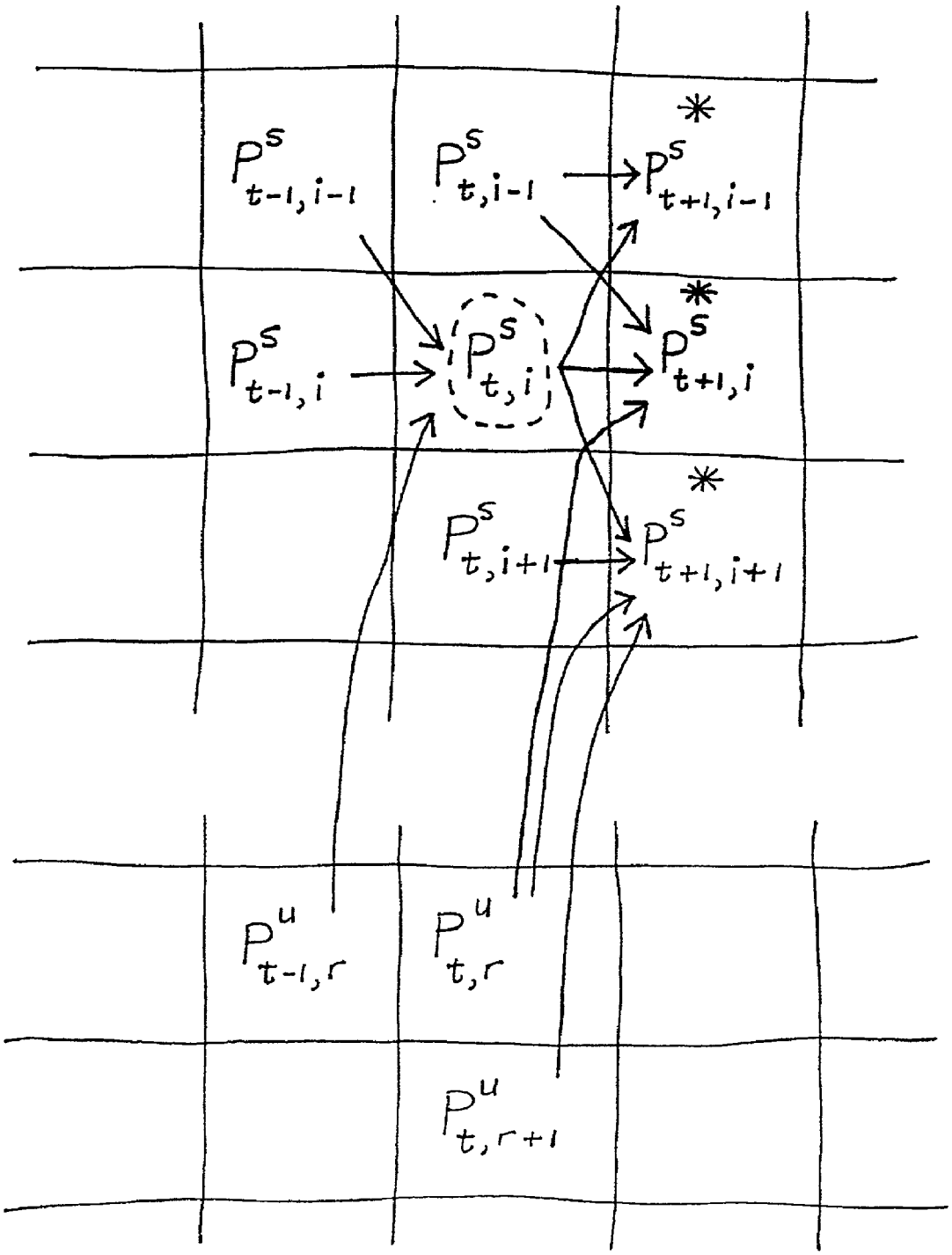

The first taxonomic type to be considered is SSFD, which is illustrated in FIG. 4C. Let w be the non-transitive fanout, in terms of a number of state partitions, of state partition i. In the case of $P_{t,i}^S$ of FIG. 4C, w=3. Let $e_1, e_2, \ldots e_w$ each represent a state partition of the non-transitive fanout of state partition i. In the case of $P_{t,i}^S$ of FIG. 4C, $e_1,e_2,e_3$ are i−1,i,i+1. Therefore, $P_{t+1,e_1}^S, P_{t+1,e_2}^S, P_{t+1,e_w}^S$ should be recalculated, with forward narrowing equation 2.1, because they might possibly shrink as a result of $P_{t,i}^S$ having shrunk. In the case of $P_{t,i}^S$ of FIG. 4C, $P_{t+1,i-1}^S, P_{t+1,i}^S, P_{t+1,i+1}^S$ (which are indicated by a star "*") should be recalculated.

3.2.2.2 SSRA

Figure 4D:
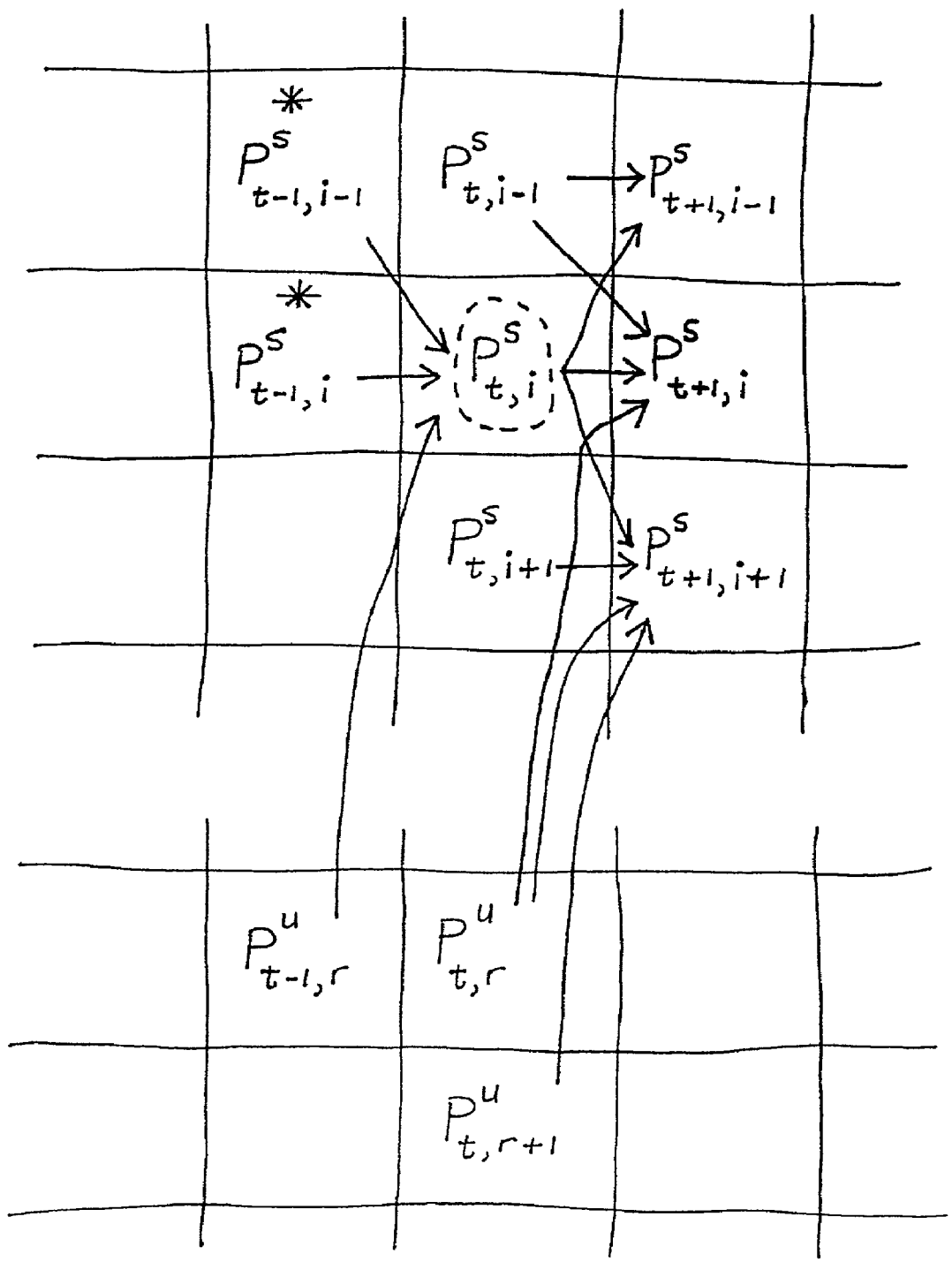

The second taxonomic type to be considered is SSRA, which is illustrated in FIG. 4D. $a_1, a_2, \ldots a_q$, as defined above, each represent a state partition of the non-transitive fanin for state partition i, where q is the non-transitive fanin, in terms of a number of state partitions, of state partition i. In the case of $P_{t,i}^S$ of FIG. 4D, q=2 and $a_1, a_2$ are i−1,i. Therefore, $P_{t-1,a_1}^S, P_{t-1,a_2}^S, \ldots P_{t-1,a_q}^S$ should be recalculated, with reverse state narrowing equation 2.2, as possibly shrinking as a result of $P_{t,i}^S$ having shrunk. In the case of $P_{t,i}^S$ of FIG. 4D, $P_{t-1,i-1}^S, P_{t-1,i}^S$ (which are indicated by a star "*") should be recalculated.

3.2.2.3 SURA

Figure 4E:
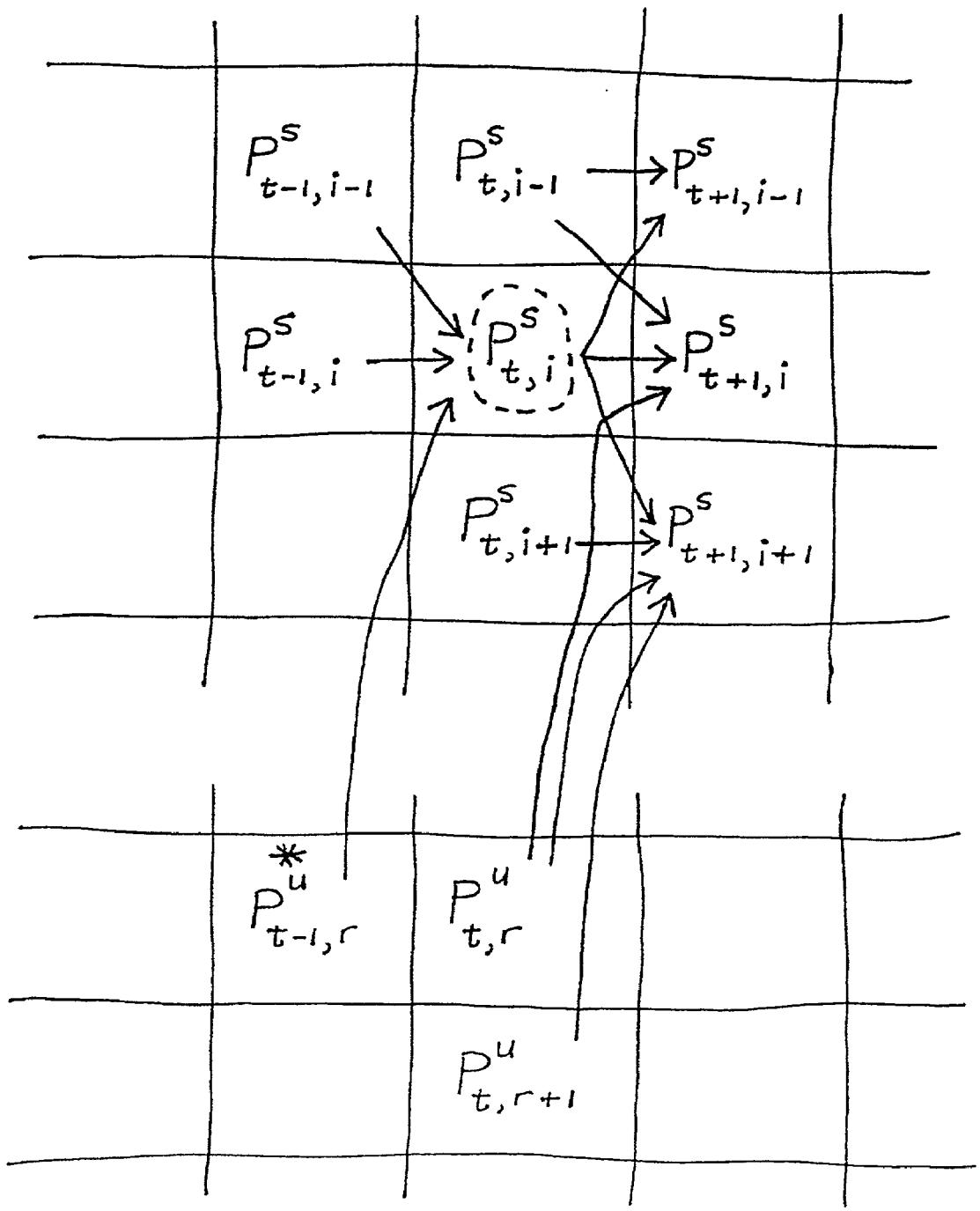

The third taxonomic type to be considered is SURA, which is illustrated in FIG. 4E. $b_1, b_2, \ldots b_p$, as defined above, each represent an input partition of the fanin for state partition i, where p is the fanin, in terms of a number of input partitions, of state partition i. In the case of $P_{t,i}^S$ of FIG. 4E, p=1 and $b_1$ is r. Therefore, $P_{t-1,b_1}^U, P_{t-1,b_2}^U, \ldots P_{t-1,b_p}^U$ should be recalculated, with reverse input narrowing equation 2.3, as possibly shrinking as a result of $P_{t,i}^S$ having shrunk. In the case of $P_{t,i}^S$ of FIG. 4E, $P_{t-1,r}^U$ (which is indicated by a star "*") should be recalculated.

3.2.2.4 SSRS

Figure 4F:
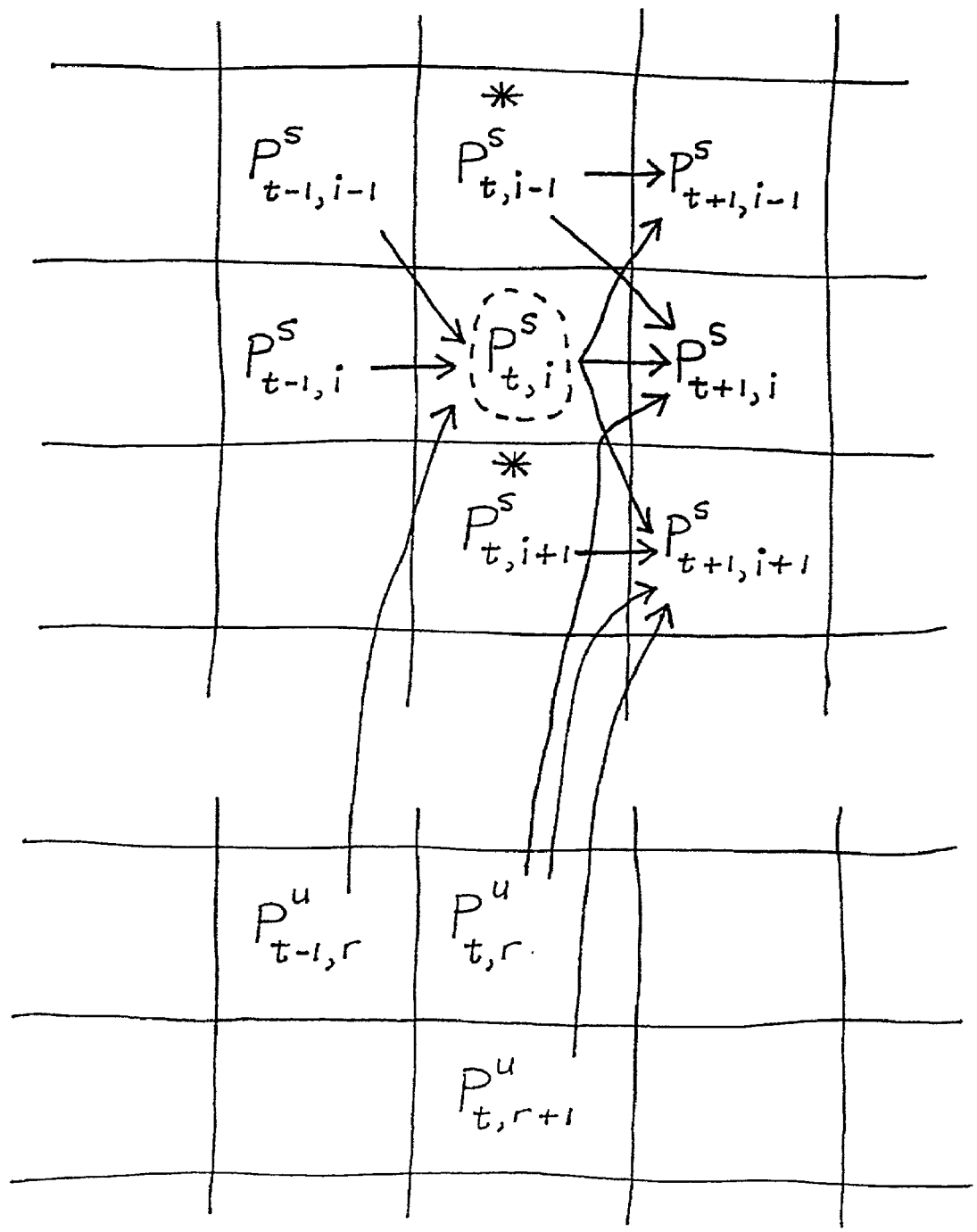

The fourth taxonomic type to be considered is SSRS, which is illustrated in FIG. 4F. As discussed above, $e_1, e_2, \ldots e_w$ each represent a state partition of the non-transitive fanout of state partition i. Also as discussed above, in the case of $P_{t,i}^S$ of FIG. 4, w=3 and $e_1, e_2, \ldots e_3$ are i−1,i,i+1. Let $fanin\_e_1, fanin\_e_2, \ldots fanin\_e_w$ each represent the fanin, in terms of a number of state partitions, for each state partition $e_1, e_2, \ldots e_w$. In the case of FIG. 4F, $fanin\_e_1, fanin\_e_2, fanin\_e_3$ are 2,2,2. The following list: ((g1$_1$,g1$_2$, ... g1$_{fanin\_e_1-1}$),(g2$_1$,g2$_2$, ... g2$_{fanin\_e_2-1}$), ... (gw$_1$,gw$_2$, ... gw$_{fanin\_e_w-1}$)), which we shall refer to as rev_lists, has each of its items being a list, which we shall refer to as a rev_list. There is one rev_list corresponding to each state partition of $e_1, e_2, \ldots e_w$. For each state partition of $e_1, e_2, \ldots e_w$, its rev_list indicates the state partitions of its fanin, except for state partition i. For example, rev_list (g1$_1$,g1$_2$, ... g1$_{fanin\_e_1-1}$) represents each state partition of the fanin of state partition $e_1$, except for state partition i. rev_list (g2$_1$, g2$_2$, ... g2$_{fanin\_e_1-1}$) represents each state partition of the fanin of state partition $e_2$, except for state partition i. rev_list (gw$_1$,gw$_2$, ... gw$_{fanin\_e_w-1}$) represents each state partition of the fanin of state partition $e_w$, except for state partition i. In the case of FIG. 4F, rev_lists is as follows: ((i−1),(i−1),(i+1)). As can be seen in FIG. 4F, $P_{t,i-1}^S, P_{t,i+1}^S$ are the state sets which are attempted to be shrunk (and are therefore starred). In terms of a computer program, reverse state narrowing equation 2.2 is utilized within a doubly-nested loop. The outer loop takes on a successive, and corresponding, pair of values from $e_1, e_2, \ldots e_w$ and rev_lists, while the inner loop iterates over each fanin state partition specified by the current rev_list. In evaluating equation 2.2, the value selected from $e_1, e_2, \ldots e_w$ determines the value for j, while each fanin state partition specified by the current rev_list determines the value for i.

3.2.2.5 SURS

Figure 4G:
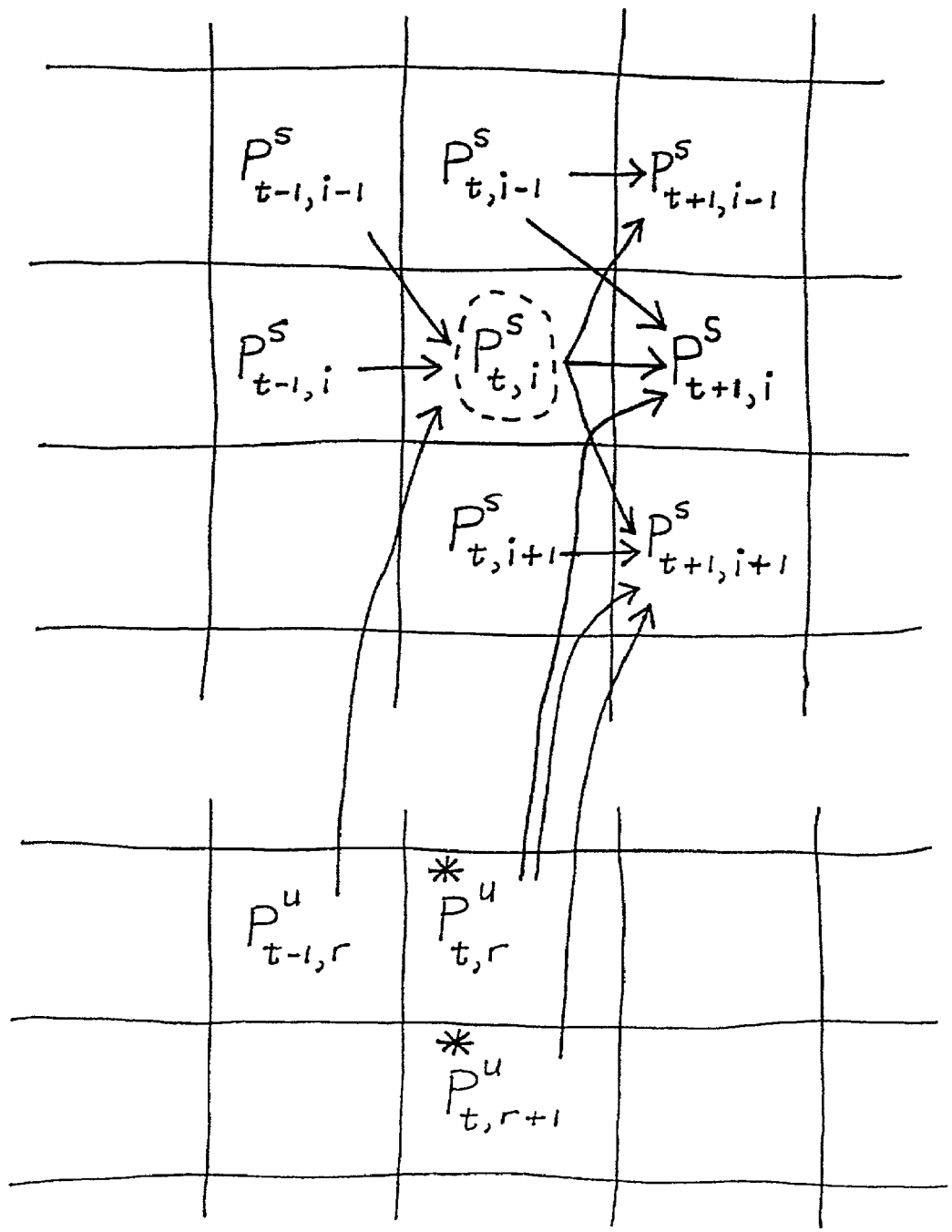

The fifth taxonomic type to be considered is SURS, which is illustrated in FIG. 4G. As discussed above, $e_1, e_2, \ldots e_w$ each represent a state partition of the non-transitive fanout of state partition i. Also as discussed above, in the case of $P_{t,i}^S$ of FIG. 4, w=3 and $e_1, e_2, e_3$ are i−1,i,i+1.

Let $fanin\_i\_e_1, fanin\_i\_e_2, \ldots fanin\_i\_e_w$ each represent the fanin, in terms of a number of input partitions, for each state partition $e_1, e_2, \ldots e_w$. In the case of FIG. 4G, $fanin\_i\_e_1, fanin\_i\_e_2, fanin\_i\_e_3$ are 0,1,2. The following list: ((y1$_1$, y1$_2$, ... y1$_{fanin\_i\_e_1}$),(y2$_1$,y2$_2$, ... y2$_{fanin\_i\_e_2}$), ... (yw$_1$, yw$_2$, ... yw$_{fanin\_i\_e_w}$)), which we shall refer to as rev_i_lists, has each of its items being a list, which we shall refer to as a rev_i_list. There is one rev_i_list corresponding to each state partition of $e_1, e_2, e_w$. For each state partition of $e_1, e_2, \ldots e_w$, its rev_i_list indicates the input partitions of its fanin. For example, rev_i_list (y1$_1$,y1$_2$, ... y1$_{fanin\_i\_e_1}$) represents each input partition of the fanin of state partition $e_1$. Likewise, rev_i_list (y2$_1$,y2$_2$, ... y2$_{fanin\_i\_e_2}$) represents each input partition of the fanin of state partition $e_2$. rev_i_list (yw$_1$,yw$_2$, ... yw$_{fanin\_i\_e_w}$) represents each input partition of the fanin of state partition $e_w$. In the case of FIG. 4G, rev_i_lists is as follows: (( ),(r),(r, r+1)). As can be seen in FIG. 4G, $P_{t,r}^U, P_{t,r+1}^U$ are the input combination sets which are attempted to be shrunk (and are therefore starred). In terms of a computer program, reverse input narrowing equation 2.3 is utilized within a doubly-nested loop. The outer loop takes on a successive, and corresponding, pair of values from $e_1, e_2, \ldots e_w$ and rev_i_lists, while the inner loop iterates over each fanin input partition specified by the current rev_i_list. In evaluating equation 2.3, the value selected from $e_1, e_2, \ldots e_w$ determines the value for j, while the value for each fanin input partition specified by the current rev_i_list determines the value for r.

3.2.2.6 USFD

Figure 4H:
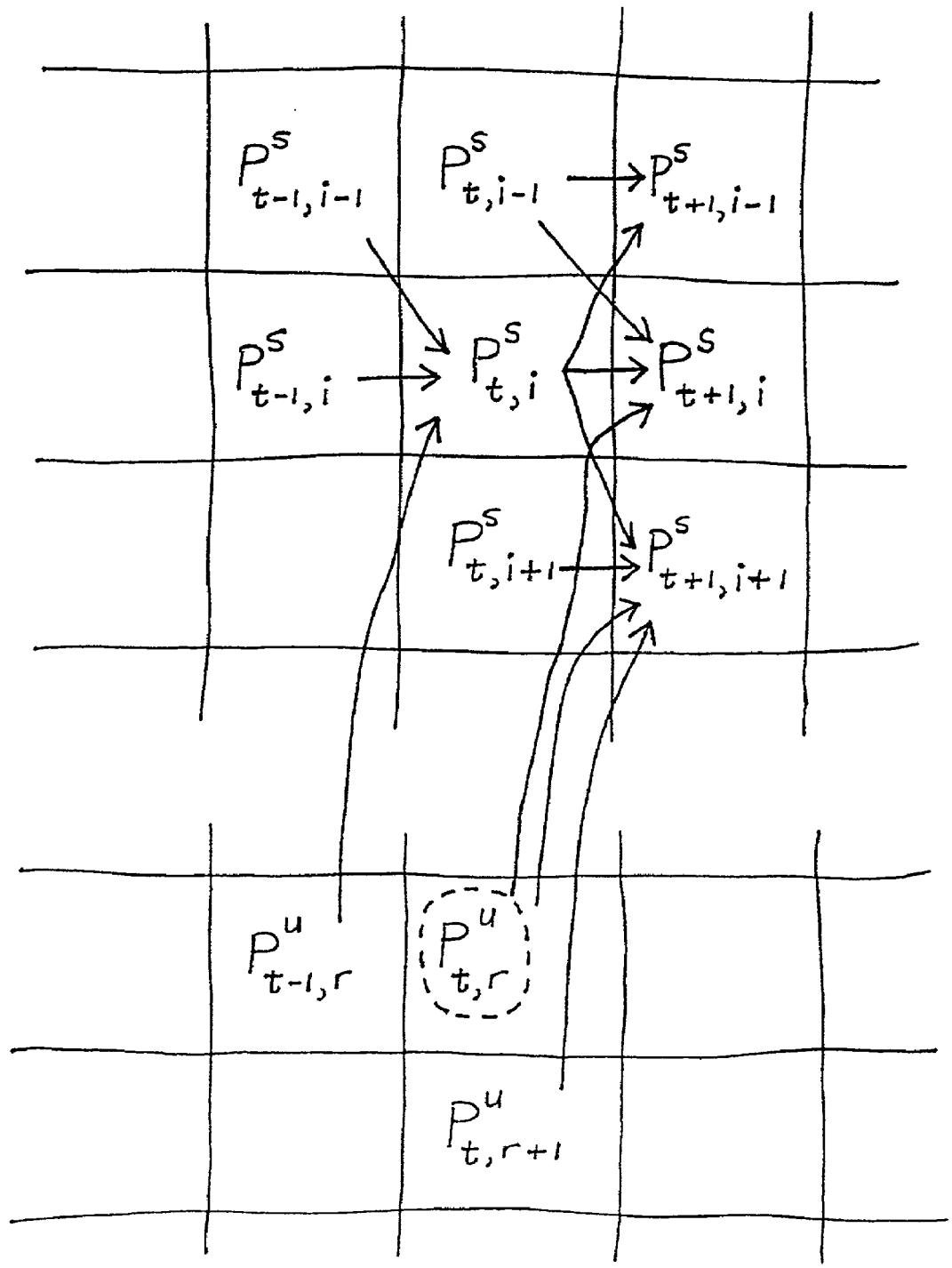

Before considering the sixth through eighth taxonomic types, FIG. 4H depicts the fact that these types are based on a particular input set of the stepping stone matrix fragment, namely set $P_{t,r}^U$, having been caused to shrink by some higher-level control procedure to be presented below. The fact that $P_{t,r}^U$ has been shrunk is indicated by its dashed encirclement.

The sixth taxonomic type, USFD, is depicted in FIG. 41. USFD is similar to the first taxonomic type SSFD, except that the triggering set is a set of input combinations rather than a set of states. Both USFD and SSFD rely on forward narrowing equation 2.1. Let z be the non-transitive fanout, in terms of a number of state partitions, of an input partition r. Let each of $h_1, h_2, \ldots h_z$ represent a state partition of the fanout for an input partition r. The forward narrowing equation 2.1 is then applied to possibly shrink each of $P_{t+1,h_1}^S, P_{t+1,h_2}^S, \ldots P_{t+1,h_z}^S$. In the case of FIG. 41, z=2, $h_1$, $h_2$ is i,i+1 and the forward narrowing equation 2.1 is applied to $P_{t+1,i}^S, P_{t+1,i+1}^S$ (which are starred in FIG. 41).

3.2.2.7 USRS

Figure 4J:
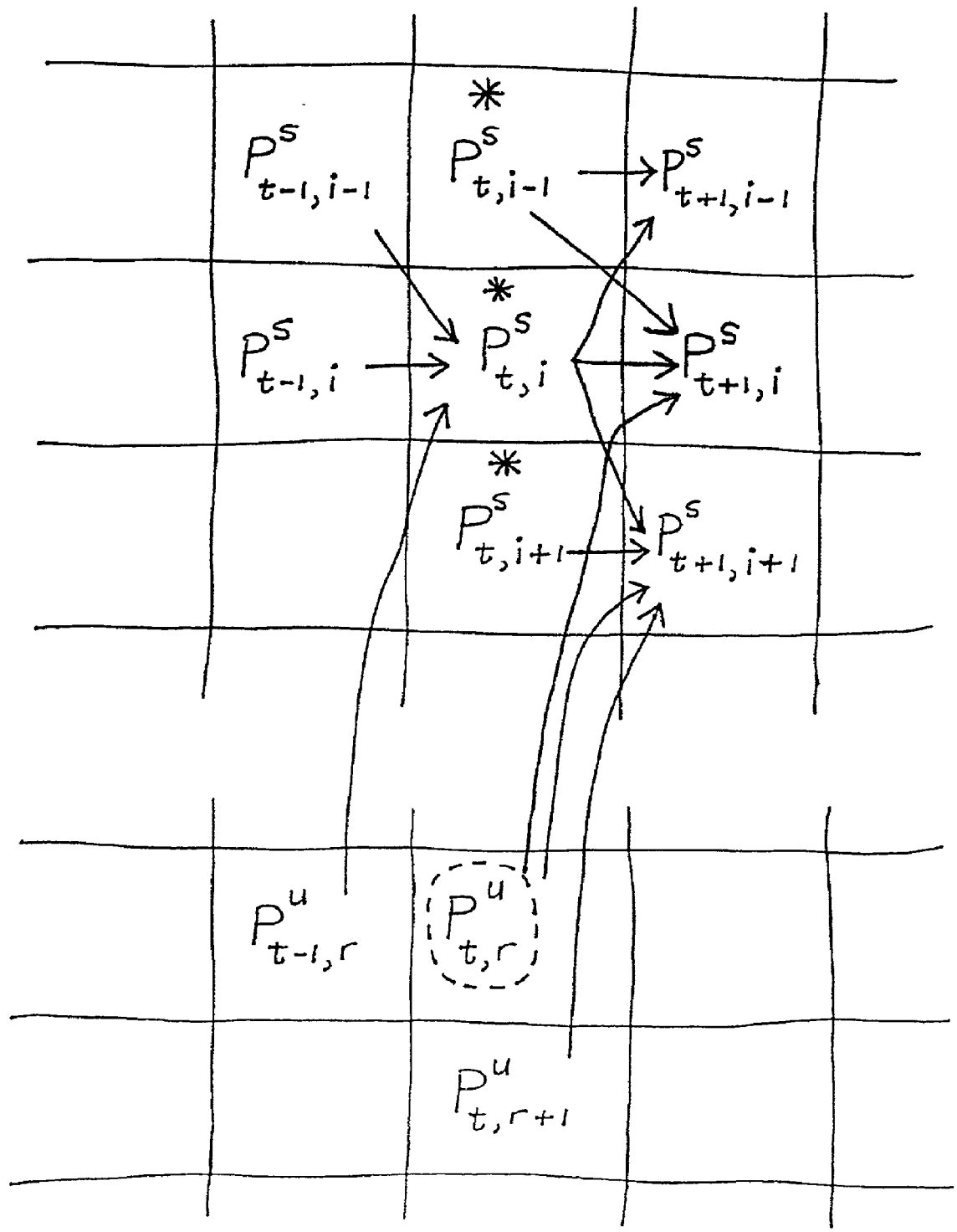

The seventh taxonomic type, USRS, is depicted in FIG. 4J.

Let fanin_$h_1$, fanin_$h_2$, ... fanin_$h_z$ each represent the fanin, in terms of a number of state partitions, for each state partition $h_1, h_2, \ldots h_z$. In the case of FIG. 4J, fanin_$h_1$, fanin_$h_2$ are 2,2. The following list: $((x1_1, x1_2, \ldots x1_{fanin\_h_1}), (x2_1, x2_2, \ldots x2_{fanin\_h_2}), \ldots (xz_1, xz_2, \ldots xz_{fanin\_h_z}))$, which we shall refer to as rev_lists, has each of its items being a list, which we shall refer to as a rev_list. There is one rev_list corresponding to each state partition of $h_1, h_2, \ldots h_z$. For each state partition of $h_1, h_2, \ldots h_z$, its rev_list indicates the state partitions of its fanin. For example, rev_list $(x1_1, x1_2, \ldots x1_{fanin\_h_1})$ represents each state partition of the fanin of state partition $h_1$. rev_list $(x2_1, x2_2, \ldots x2_{fanin\_h_2})$ represents each state partition of the fanin of state partition $h_2$. rev_list $(xz_1, xz_2, \ldots xz_{fanin\_h_z})$ represents each state partition of the fanin of state partition $h_z$. In the case of FIG. 4J, rev_lists is as follows: ((i—1,i), (i,i+1)). As can be seen in FIG. 4J, $P_{t,i-1}^S, P_{t,i}^S, P_{t,i+1}^S$ are the state sets which are attempted to be shrunk (and are therefore starred). In terms of a computer program, reverse state narrowing equation 2.2 is utilized within a doubly-nested loop. The outer loop takes on a successive, and corresponding, pair of values from $h_1, h_2, \ldots h_z$ and rev_lists, while the inner loop iterates over each fanin state partition specified by the current rev_list. In evaluating equation 2.2, the value selected from $h_1, h_2, \ldots h_z$ determines the value for j, while the each fanin state partition specified by the current rev_list determines the value for i.

3.2.2.8 UURS

Figure 4K:
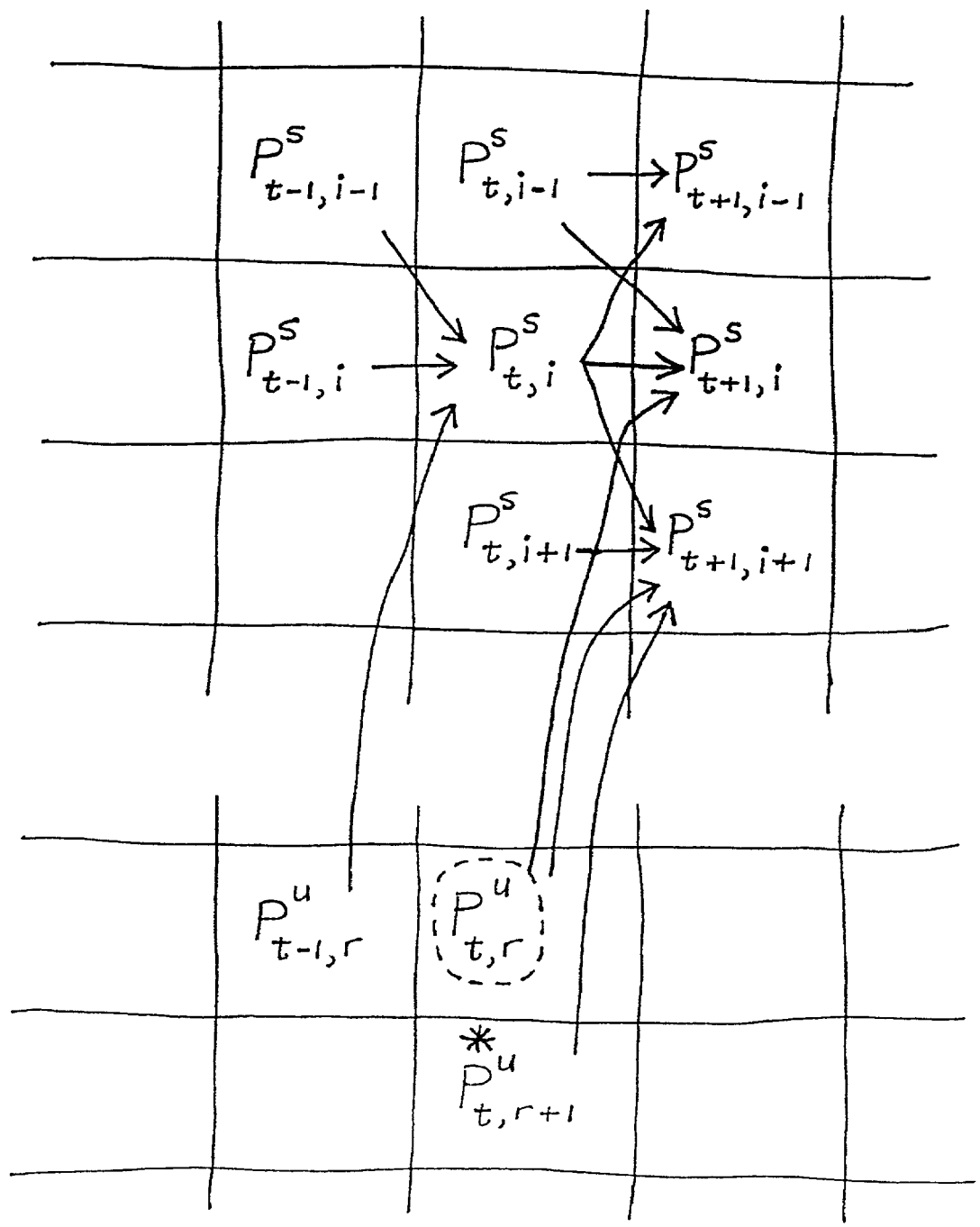

The eighth taxonomic type to be considered is UURS, which is illustrated in FIG. 4K. As discussed above, $h_1$, $h_2, \ldots h_z$ each represent a state partition of the fanout of input partition r. Also as discussed above, in the case of $P_{t,r}^U$ of FIG. 4, z=2 and $h_1, h_2$ is i,i+1. Let fanin_i_$h_1$, fanin_i_$h_2$, ... fanin_i_$h_z$ each represent the fanin, in terms of a number of input partitions, for each state partition $h_1, h_2, \ldots h_z$. In the case of FIG. 4K, fanin_i_$h_1$, fanin_i_$h_2$ are 1,2. The following list: $((xi1_1, xi1_2, \ldots xi1_{fanin\_i\_h_1-1})(xi2_1, xi2_2, \ldots xi2_{fanin\_i\_h_2-1}), \ldots (xiz_1, xiz_2, \ldots xiz_{fanin\_i\_h_z-1}))$ which we shall refer to as rev_i_lists has each of its items being a list, which we shall refer to as a rev_i_list. There is one rev_i_list corresponding to each state partition of $h_1, h_2, \ldots h_z$. For each state partition of $h_1, h_2, \ldots h_z$, its rev_i_list indicates the input partitions of its fanin, with the exception of input partition r. For example, rev_i_list $(xi1_1, xi1_2, \ldots xi1_{fanin\_i\_h_1-1})$ represents each input partition of the fanin of state partition $h_1$, with the exception of input partition r. Likewise, rev_i_list $(xi2_1, xi2_2, \ldots xi2_{fanin\_i\_h_2-1})$ represents each input partition of the fanin of state partition $h_2$, with the exception of input partition r. rev_i_list $(xiz_1, xiz_2, \ldots xiz_{fanin\_i\_h_z-1})$ represents each input partition of the fanin of state partition $h_z$, with the exception of input partition r. In the case of FIG. 4K, rev_i_lists is as follows: (( )(r+1)). As can be seen in FIG. 4K, $P_{t,r+1}^U$ is the input combination which is attempted to be shrunk (and is therefore starred). In terms of a computer program, reverse input narrowing equation 2.3 is utilized within a doubly-nested loop. The outer loop takes on a successive, and corresponding, pair of values from $h_1, h_2, \ldots h_z$ and rev_i_lists, while the inner loop iterates over each fanin input partition specified by the current rev_i_list. In evaluating equation 2.3, the value selected from $h_1, h_2, \ldots h_z$ determines the value for j, while the value for each fanin input partition specified by the current rev_i_list determines the value for r.

3.2.2.9 Additional Considerations

The above-described taxonomic types assume that the cause of the trigger set's shrinkage is irrelevant. In fact, if the trigger set has been shrunken as a result of certain taxonomic operations, then other taxonomic types of shrinkage are known not to result.

For example, if the trigger set (a state set) shrunk because of USFD, then it will not cause shrinking by SSRA or SURA. If the trigger set (a state set) shrunk because of SSFD, then it will not cause shrinking by SURA or SSRA.

If the trigger set (a state set) has shrunken because of SSRA, as applied to a particular "j" term, then it will not cause shrinking by SSFD recalculating that same "j" term. Similarly, if the trigger set (an input set) has shrunken because of SURA, as applied to a particular "j" term, then it will not cause shrinking by USFD recalculating that same "j" term.

If the trigger set (a state set) has shrunken because of SSRS as applied to a particular "j" term, then it will not cause shrinking by SSRS applied to that same "j" term.

If the trigger set (a state set) has shrunken because of USRS as applied to a particular "j" term, then it will not cause shrinking by SSRS applied to that same "j" term.

If the trigger set (a state set) has shrunken because of SSRS as applied to a particular "j" term, then it will not cause shrinking by SURS applied to that same "j" term.

If the trigger set (a state set) has shrunken because of USRS as applied to a particular "j" term, then it will not cause shrinking by SURS applied to that same "j" term.

If the trigger set (an input set) has shrunken because of SURS as applied to a particular "j" term, then it will not cause shrinking by USRS applied to that same "j" term.

If the trigger set (an input set) has shrunken because of UURS as applied to a particular "j" term, then it will not cause shrinking by USRS applied to that same "j" term.

If the trigger set (an input set) has shrunken because of SURS as applied to a particular "j" term, then it will not cause shrinking by UURS applied to that same "j" term.

If the trigger set (an input set) has shrunken because of UURS as applied to a particular "j" term, then it will not cause shrinking by UURS applied to that same "j" term.

In the discussion below re the bidirectional_approx procedure, the cause of the trigger set's shrinkage could be added to restrict which further computations are scheduled on the rev_comp and fwd_comp lists.

3.2.3 Bidirectional Approximation Control Strategy

The third main part of presenting bidirectional approximation, the efficient control strategy, is as follows.

The bidirectional approximation control strategy is presented in conjunction with the pseudo code of FIGS. 5A–E which presents a function, "bidirectional_approx," that receives the argument "approx_path." FIG. 5B, line 3. approx_path is a data structure like the stepping stone matrix of FIG. 3. FIG. 5A presents the pseudo code "path" datatype of approx_path. Like the stepping stone matrix of FIG. 3, it is assumed that the approx_path passed to bidirectional_approx has every state set at its max_time having a non-null intersection with its corresponding error states set.

bidirectional_approx begins by shrinking each state set at max_time by replacing it with its intersection with its corresponding error states set. FIG. 5B, lines 10–11. For each state set shrunk, it is determined which of the reverse state or reverse input narrowings are thereby triggered for potential shrinking. FIG. 5B, lines 13–15. The taxonomic types of these initial reverse narrowings which may be triggered are SSRA or SURA. These potential reverse narrowings are added to the list "rev_comps." Added to rev_comps is an indication of the set which forms the "j" term in the appropriate reverse narrowing equation. The "i" or "r" terms, which are associated with a particular "j," are determined "on the fly." The "j" term is the single state partition at time t+1 utilized by the above-presented equation 2.2 in determining a narrowed state set (the "i" term) at time t. Similarly, the "j" term is also the single state partition at time t+1 utilized by the above-presented equation 2.3 in determining a narrowed input set (the "r" term) at time t.

The main loop of bidirectional_approx is then begun. FIG. 5B, line 19. The main loop comprises two sub-loops which, respectively, loop through reverse narrowing computations (FIG. 5B, line 24–FIG. 5D, line 26) and forward narrowing computations (FIG. 5E, lines 4–26).

For reverse narrowing, the sub-loop selects each "j" term (j_term) on the list "rev_comps." FIG. 5B, line 24. For each j_term, its corresponding "i" terms (i_terms) and "r" terms (r_terms) are found "on the fly" by finding, respectively, the state and input fanins of the j_term. FIG. 5B, lines 26–27.

By determining the "i" or "r" terms "on the fly," however, a negligible amount of redundant reverse state or reverse input computation is performed in the following situation. Where the j_term was added to rev_comps as a result of a trigger set, call it $P_{trigger}^S$, triggering reverse narrowings of type SSRS, the i_terms of the j_term should not include that same trigger set $P_{trigger}^S$. Likewise, where the j_term was added to rev_comps as a result of a trigger set, call it $P_{trigger}^U$, triggering reverse narrowings of type UURS, the r_terms of the j_term should not include that same trigger set $P_{trigger}^U$. This slight inefficiency could be removed by an event queue which recorded the corresponding "i" and "r" terms along with each "j" term.

For each j_term and i_term pair (looped over by the sub—sub-loop of FIG. 5C) a reverse state narrowing is done, according to equation 2.2 (FIG. 5C, line 3), in order to attempt to create a new narrowed i_term (new_i_term). If the (new_i_term) is indeed narrower than i_term, then:

i) (new_i_term) replaces i_term in approx_path.state_sets (FIG. 5C, lines 8–9);

ii) the resulting new "j" terms (new_i_term) which may be triggered by (new_i_term) are found (FIG. 5C, line 11; each new "j" term bears a relationship to (new_i_term), in accordance with one of types SSRA, SURA, SSRS or SURS, where (new_i_term) is the trigger set);

iii) the new_i_terms are added to rev_comps immediately, and rev_comps is sorted such that in subsequent iterations (of the reverse narrowing sub-loop) terms latest in time are taken first (FIG. 5C, lines 13–15);

iv) the new forward computations (new_fwd_comps) which may be triggered by new_i_term are found (FIG. 5C, lines 17–18; each "i" term of new_fwd_comps being a state set at a time t, bearing the relationship of type SSFD to the trigger set new_i_term at time t−1); and v) the new_fwd_comps are added to fwd_comps immediately, and fwd_comps is sorted such that in subsequent iterations (of the forward narrowing sub-loop) terms earliest in time taken first (FIG. 5C, lines 20–23).

For each j_term and r_term pair (looped over by the sub—sub-loop of FIG. 5D) a reverse state narrowing is done, according to equation 2.3 (FIG. 5D, line 3), in order to attempt to create a new narrowed r_term (new_r_term). If the new_r_term is indeed narrower than r_term, then:

i) new_r_term replaces r_term in approx_path.input_sets (FIG. 5D, lines 8–9);

ii) the resulting new "j" terms (new_j_terms) which may be triggered by new_r_term are found (FIG. 5D, line 11; each new "j" term bears a relationship to new_r_term, in accordance with one of types USRS or UURS, where new_r_term is the trigger set);

iii) the new_j_terms are added to rev_comps immediately, and rev_comps is sorted such that in subsequent iterations (of the reverse narrowing sub-loop) terms latest in time are taken first (FIG. 5D, lines 13–15);

iv) the new forward computations (new_fwd_comps) which may be triggered by new_r_term are found (FIG. 5D, lines 17–18; each "i" term of new_fwd_comps being a state set at a time t, bearing the relationship of type USFD to the trigger set new_r_term at time t−1); and v) the new_fwd_comps are added to fwd_comps immediately, and fwd_comps is sorted such that in subsequent iterations (of the forward narrowing sub-loop) terms earliest in time taken first (FIG. 5D, lines 20–23).

The reverse narrowing sub-loop will continue to iterate until there are no more "j" terms. Since rev_comps is continually being ordered such that latest times are taken first, the loop gradually works its way back from the max_time to some earliest time at which reverse narrowing can occur. By the time the earliest reverse narrowings have all been executed, a list of forward narrowings may have been built up on fwd_comps.

For each i_term (looped over by the forward narrowing sub-loop of FIG. 5E, lines 4–26) a forward narrowing is done, according to equation 2.1 (FIG. 5E, line 6), in order to attempt to create a new narrowed i_term (new_i_term). In accordance with equation 2.1 presented above, the i_term is the state set at time t to be narrowed by the state or input sets at time t−1. If the new_i_term is indeed narrower than i_term, then:

i) new_i_term replaces i_term in approx_path.state_sets (FIG. 5E, lines 11–12);

ii) the resulting new "j" terms (new_j_terms) which may be triggered by (new_i_term) are found (FIG. 5E, line 14; each new "j" term bears a relationship to new_i_term, in accordance with one of types SSRA, SURA, SSRS or SURS, where new_i_term is the trigger set);

iii) the new_i_terms are added to rev_comps immediately, and rev_comps is sorted such that in subsequent iterations (of the reverse narrowing sub-loop) terms latest in time are taken first (FIG. 5E, lines 16–18);

iv) the new forward computations (new_fwd_comps) which may be triggered by (new_i_term) are found (FIG. 5E, line 20; each "i" term of new_fwd_comps being a state set at a time t, bearing the relationship of type SSFD to the trigger set new_i_term at time t−1); and v) the new_fwd_comps are added to fwd_comps immediately, and fwd_comps is sorted such that in subsequent iterations (of the forward narrowing sub-loop) terms earliest in time taken first (FIG. 5E, lines 22–24).

The forward narrowing sub-loop will continue to iterate until there are no more "i" terms. Since fwd_comps is continually being ordered such that earliest times are taken first, the loop gradually works its way forward from the earliest time to some latest time at which forward narrowing can occur. By the time the latest forward narrowings have all been executed, a list of backward narrowings may have been built up on rev_comps.

The main loop of bidirectional_approx will continue to alternate between its reverse and forward narrowing sub-loops while the following condition is true: there are still reverse narrowings to be determined on rev_comps OR there are still forward narrowings to be determined on fwd_comps. The main loop may also terminate if one of the state sets or input sets becomes empty after a shrink (see FIG. 5C, line 4; FIG. 5D, line 4; FIG. 5E, line 7). If the main loop terminates because one of the state sets in approx_path becomes empty, then there is no path, of length max_time, from the initial state of the stepping stone matrix (represented by $P_{0,1}^S, P_{0,2}^S, \ldots P_{0,n}^S$) to the error_states. Otherwise, if the main loop merely terminates "normally," then the "stepping stones" between the initial state and the error states have been narrowed, maximally, using equations 2.1 to 2.3.

Thus, the bidirectional approximation control strategy is a type of event-driven control in which the bidirectional_approx begins with the initial events of shrinking each state set at max_time and then determining the further shrinkages (i.e., events) that cascade therefrom. The manner which in which shrinkages cascade is preferrably controlled, as described, to alternate between performing all reverse narrowings (until those events are at least temporarily exhausted) and all forward narrowings (until those events are at least temporarily exhausted). The procedure ends when the approx_path stepping stone matrix has settled into a new state (that is narrower with respect to its initial state) from which no further events can be triggered.

4. Higher-Level Control Structure

4.1 Overview

Now that the two formal techniques of forward approximation and bidirectional approximation have been described, a higher level control structure, which utilizes these techniques to constrain random simulation, in order to find a path from the initial state $s_{0,1}, s_{0,2} \ldots s_{0,n}$ to a final state $s_{f,1}, s_{f,2} \ldots s_{f,n}$ at some time f, is presented.

The basic procedure, by which the formal techniques of the present invention and random simulation interact, is by means of a two-part cycle. The first phase of the cycle is the application of formal techniques to determine an overapproximated path from an initial state of $FSM_{verify}$ to a goal state of $FSM_{verify}$. The second phase of the cycle is the application of random simulation to determine at least a partial underapproximated path within the overapproximated path of the first phase. Thus, the determination of an underapproximated path by the second phase is constrained by the overapproximated path of the first phase. Using the underapproximated path determined by the second phase, the first phase of a successive cycle is started in which formal techniques are used to determine an overapproximated path from an initial state of $FSM_{verify}$ to a goal state of $FSM_{verify}$, but the formal techniques are applied between the remaining gaps of the underapproximated path. Successive two-phase cycles are performed until the underapproximation phase has produced an actual sequence of states that spans from an initial state of $FSM_{verify}$ to a goal state of $FSM_{verify}$.

The higher-level control structure, presented herein for implementing this basic two-part cycle, is one of recursively spawning processes that execute concurrently. Certain of the spawned processes perform formal overapproximation techniques, while other of the spawned processes perform simulation. The type of search thereby implemented would be exhaustive, but for the execution of each spawned process being limited by its priority level relative to the other spawned processes. Therefore, the priority levels assigned act as a kind of heuristic for focusing the search into more productive avenues. While a particular assignment of priorities is presented herein, by way of example, any variety of priority-assignment technique can be used so long as it acts to focus searching in productive ways.

Furthermore, while a technique of heuristically limited recursively spawned processes is presented herein by way of an example implementation approach, any type of higher-level control structure can be utilized for implementing the basic two-part cycle of the present invention. Due to the computational complexity of the verifications problems to which the present invention is typically directed, it is generally advantageous to utilize a higher-level control structure which utilizes heuristics.

It should also be noted that while the present preferred embodiment utilizes random simulation as a type of underapproximation technique, operating in conjunction with formal overapproximation techniques, any other type of underapproximation technique may be utilized since such other underapproximation technique will also be constrained by the formal overapproximation techniques presented herein.

4.2 Pseudo Code

There are three basic spawned processes used: forward_approx, bidirectional_approx and simulate. These processes, and the overall control strategy they are used to implement, are depicted in pseudo code of FIG. 6. Each of these procedures takes two arguments: approx_path and actual_path. approx_path represents a stepping stone matrix, and therefore an overapproximate path, while actual_path represents an underapproximate path of states in sequence.

Each invocation of foward_approx (FIG. 6D) performs a single application of the forward approximation technique, described previously (Section 3.1 Forward Approximation), upon its approx_path argument and produces a stepping stone matrix (referred to by the variable aug_approx_path) whose path is longer than the approx_path argument by one additional time step. FIG. 6D, lines 5–15. forward_approx then spawns another forward_approx process with an incrementally lower priority. FIG. 6D, lines 17–18.

bidirectional_approx (FIGS. 6E–H) functions in the same way as described above (3.2.3 Bidirectional Approximation Control Strategy), taking its "actual_path" argument (FIG. 6E, line 3) and producing a pruned (or narrowed) path that is still overapproximate. See FIG. 6F, lines 8–9, FIG. 6G, lines 8–9 and FIG. 6H, lines 11–12 where, respectively, state sets, input sets and state sets are replaced by narrowed versions of themselves. As part of operating within the higher-level control structure, bidirectional_approx also spawns a "simulate" process before terminating (FIG. 6H, lines 30–32). This simulate process is given the maximum priority level defined by the variable "max_prio."

The "simulate" procedure, of FIGS. 6I–J, assumes that the approx_path passed to it has been determined with its time-step 0 state being the same as the last state of it's actual_path argument. Each invocation of simulate (FIGS. 6I–J) takes the last state of actual_path (referred to by the variable end_of_path at FIG. 6I, line 12) and peforms one time step of simulation $FSM_{verify}$ (see FIG. 6I, lines 18–20) to produce a new last state for actual_path (see FIG. 6I, lines 22–26). Note that each item of the actual_path list is itself comprised of two items: a state for $FSM_{verify}$ and an input combination for transitioning $FSM_{verify}$ to the next state of actual_path.

For the one-step simulation an input combination (input_vector), that is contained in the approx_path input sets for time 0, must be also applied $FSM_{verify}$. The input combination is found by "random_valid_input" performing a random walk of the BDDs. FIG. 6I, line 16. The one step simulation of $FSM_{verify}$, performed by one_step_fsm_verify (FIG. 6I, line 20), produces a next state called "next_state" which is concatenated onto a copy of the existing actual_path to produce a "new_actual_path." FIG. 6I, lines 22–26.

A random walk of a BDD can be made to always produce a member of the set it represents as follows. Begin at the root node of the BDD. At each node, including the root, randomly choose to pursue either the "true" or "false" branch from that node. If the "1" leaf node of the BDD is reached, then the walk has produced a member of the set represented by the BDD. If the "0" leaf node of the BDD is reached, then backtrack to the next-to-last node and choose the other branch which must, due to the structure of BDDs, lead by some path to the "1" leaf node.

The first action "simulate" always takes is to spawn off another "simulate" process, at an incrementally lower priority, to try another randomly generated input combination. FIG. 6I, lines 9–10. It is preferable, for each approx_path being tried, that the recursive calls to "simulate" are random cyclic meaning that each such call randomly generates a different input_vector until all possible input vectors have been generated.

If the next state resulting from the one-step simulation of $FSM_{verify}$ is contained in the error state sets, then the entire search process is halted and new_actual_path is returned to the user as a concrete path from the initial state to an error state. FIG. 6I, lines 28–30. If the next state resulting from the one-step simulation of $FSM_{verify}$ if is not contained in the error state sets, then "simulate" continues as follows.

The next_state resulting from the one-step simulation of $FSM_{verify}$ is tested to verify that it is contained in the approx_path state sets for time 1 and that it has not already been generated by another simulation process. FIG. 6J, lines 1–2. When such a next_state is found, then:
 i) next_state is added to a global has table so that it will not be pursued by another process (FIG. 6J, line 6),
 ii) a new_approx_path is determined with a stepping stone matrix that just contains state sets at time 0, just contains input sets at time 0, just contains next_state in the state sets, contains any input combination in the input sets and has max_time set to 0 (FIG. 6J, lines 8–10); and
 iii) a forward_approx process is spawned with new_approx_path and new_actual_path as its arguments (FIG. 6J, lines 12–13.

For purposes of pseudo code illustration, processes are spawned (or spun off) with a "spawn_process" function that takes as arguments: the priority the spun off process is to assume and a call to the function to be spun off as an independent process. All functions spun off with spawn_process are concurrently scheduled processes, whose execution with respect to each other is only limited by their relative priorities. While the pseudo code for spawn_process itself is not shown, it is called at the following locations in FIG. 6:

FIG. 6C, line 27, as part of initially starting a state space search, in accordance with the higher-level control structure presented herein, with the invocation of a forward_approx process;
 FIG. 6D, lines 17–18, as part of continuing a forward approximation state space search;
 FIG. 6D, lines 25–26, as part of forking off a bidirectional approximation narrowing process from a forward approximation state space search;
 FIG. 6H, lines 30–32, as part of spawning a "simulate" process before terminating a bidirectional approximation narrowing process;
 FIG. 6I, lines 9–10, as part of spawing another, parallel, simulation process to search for a goal state; and
 FIG. 6J, lines 12–13, as part of starting a new forward approximation search using a just-simulated-to state as the new starting point.

4.3 EXAMPLE

The operation of the overall search control structure of FIG. 6 is illustrated in conjunction with the example shown in FIGS. 7 and 8. Starting from an initial state, FIG. 7 depicts a series of process invocations. Each process is depicted with three items of information:
 i) the type of the process, these are "FA" for forward_approx (FIG. 6D, line 3), "BA" for bidirectional_approx (FIG. 6E, line 3) and "Sim" for simulate (FIG. 6I, line 4);
 ii) a unique process ID (indicated by "ID#<unique num>"); and
 iii) a process priority (indicated by "PRIO=<a priority level>") that indicates, relative to all other processes, a processes relative priority in claiming processor execution resources.

FIG. 8 is essentially a greatly detailed presentation of FIG. 7. FIG. 8 presents the "central column" of the processes of FIG. 7, namely:
 initial (FIG. 8A),
 ID#1 (FIG. 8B),
 ID#2 (FIG. 8C),
 ID#3 (FIG. 8D),
 ID#5 (FIG. 8E),
 ID#6 (FIGS. 8F–G),
 ID#8 (FIG. 8H),
 ID#9 (FIG. 8I),
 ID#12 (FIG. 8J),
 ID#13 (FIGS. 8K–L),
 ID#16 (FIG. 8M),
 ID#17 (FIG. 8N), and
 ID#18 (FIG. 8O).

This "central column" of processes is intended to represent a complete line of search, starting with the variable actual_path just containing the initial state (as shown in FIG. 8A, line 4) and ending with a three time-step path that reaches a goal state (as shown in FIG. 8O, lines 26–28).

While the below discussion of FIG. 7 focuses on the "central column" of processes, it can be seen in FIGS. 7A–B that other avenues of search are also spawned. For example, when process ID#3 spawns the bidirectional_approx process ID#5, it also spawns another forward_approx process ID#4. While not shown in FIG. 7, this chain of forward_approx invocations continues indefinitely, but is limited by the decreasing priority of each succeeding forward_approx process. For example, the process ID#4 already has a priority of 4, meaning that it must wait for all higher level processes to complete before it will be processed further. As can be seen, all the processes of the "central column" of FIG. 7, with the exception of process ID#3, have priorities of either 1 or 2. These consistently high priorities mean that while the "central column" is not executed in a simple linear fashion, the higher-level control structure does tend to greatly focus upon it and bring it to rapid conclusion. Were this "central column," however, not able to reach a goal state, then the other branches from it are available for the pursuit of other potential solutions.

A discussion of the execution of the "central column" of FIG. 7, in terms of the higher-level control structure of FIG. 6, follows. Also, certain of the other avenues of search that deviate from this "central column" are discussed briefly.

The higher-level control structure has declarations of important data structures in FIG. 6A and the first pseudo code to be "executed" are the initializations of FIG. 6B.

An Initial Process initializes approx_path to contain only an initial state at time 0, and to accept any input combination at time 0. FIG. 6C, lines 1–21. If the initial state has a non-null intersection with the error_states, then the initial state is a path to a goal state and the search process ends. FIG. 6C, line 25. In the much more typical case, however, the Initial Process spawns off a foward_approx process with approx_path having the initialized value and actual_path being a list of only the initial state. FIG. 6C, line 27. When the initial process spawns off a forward_approx process, the forward_approx process is given the highest priority level of "max_prio."

Figure 7A:
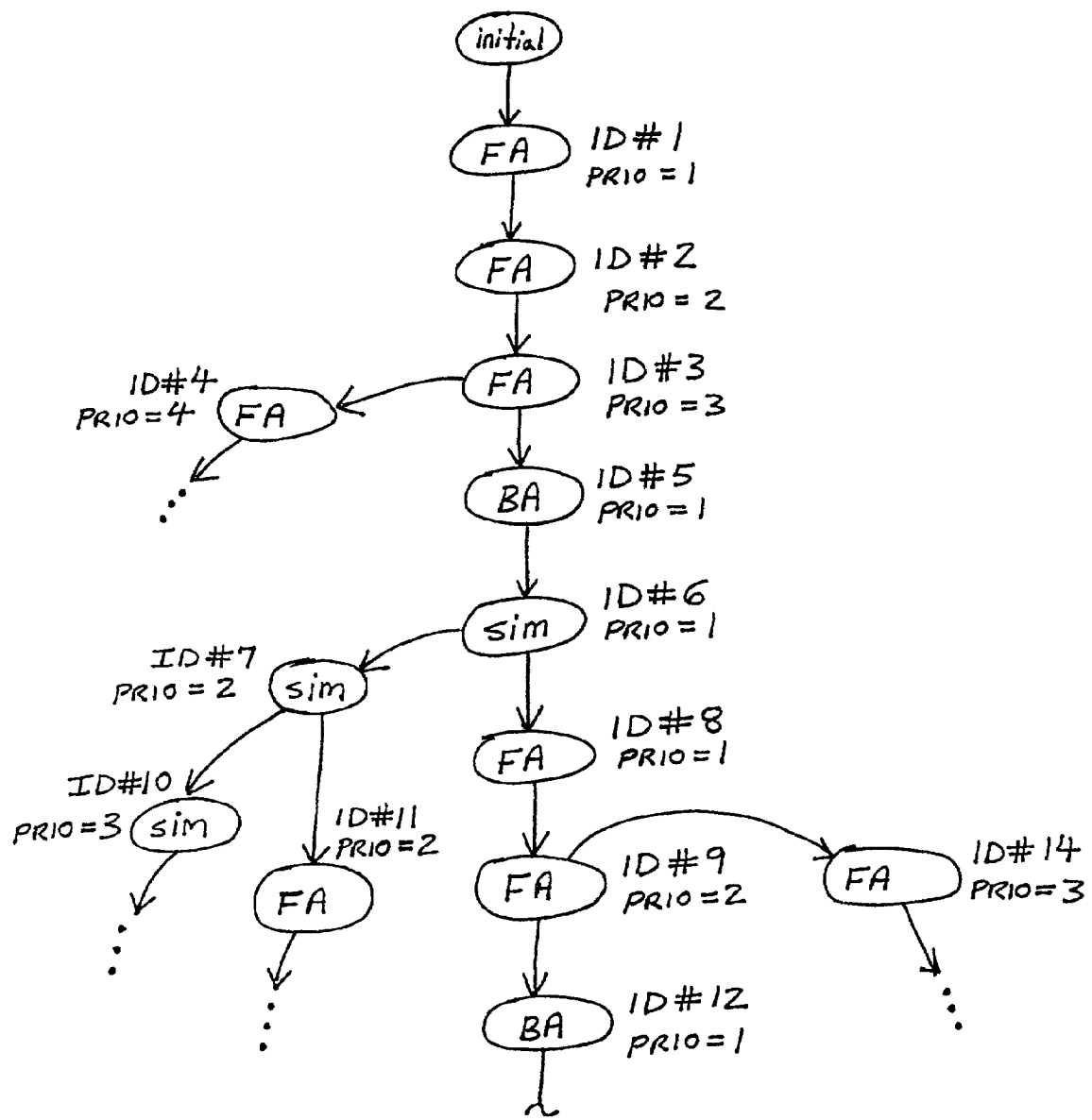
FIGS. 7A–7B illustrate an exemplary recursively spawned execution of the higher-level control structure.
Figure 7B:
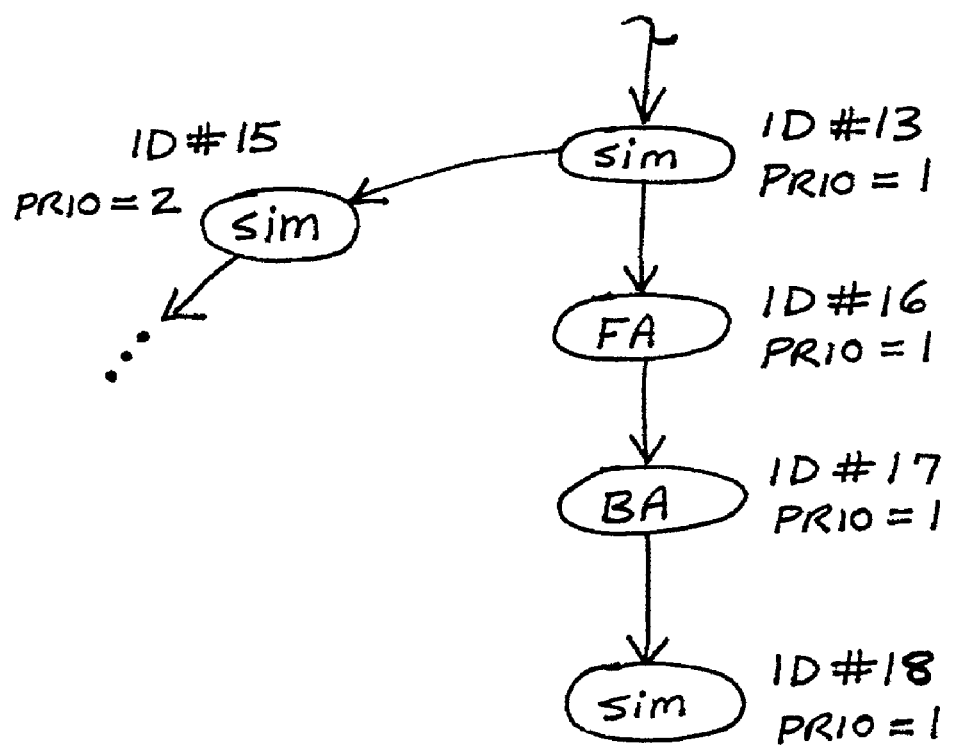

In the example of FIG. 7A, the forward_approx process, spun off by the initial process, is given a unique process ID#1. As can be seen in the example of FIG. 8A, the Initial Process initializes approx_path to have 3 state partitions, 2 input partitions and a max_time of 0. actual_path, the variable that is to contain a sequence of states reachable from a start state of $FSM_{verify}$, is initialized to contain the initial state chosen.

From the initial state, three invocations to forward_approx are done, to create processes ID#1, ID#2 and ID#3, to bring the stepping stone matrix of approx_path forward by three time steps until a goal state is reached. See the approx_path matrix of process ID#3 shown in FIG. 8D, lines 9–18. The approx_path matrix of ID#3 represents an overapproximate path from a start state to a goal (or error) state. As can be seen in FIG. 7A, each of processes ID#1, ID#2 and ID#3 has a successively lower priority.

Having found an overapproximate path, the focus of the higher-level control structure changes (see FIG. 6D, lines 24–26, where reaching a goal state causes invocation of bidirectional_approx) to trying to lessen the amount of overapproximation of the overapproximated path.

It should be noted, however, that off of the "central column" is a chain of forward_approx invocations that continue concurrently. As can be seen in FIG. 7A, in addition to spawning process ID#5 of the "central column," process ID#3 also spawns another foward_approx process ID#4. Process ID#4, however, is given an incrementally lower priority of 4, while process ID#5 is given the max_prio priority level of 1.

Note that since the path of the stepping stone matrix of ID#3 is overapproximate, there may not be, in fact, an actual path of states from start state to goal state. This uncertainty is due to the fact that overapproximate sets of states contain states additional to those that could actually be reached by the $FSM_{verify}$ at each step along the path.

The high priority objective of the higher-level control structure is to try to prune (or narrow) the overapproximate state sets, of the approx_path of ID#3, as much as possible to enhance the chances that a path of actual states can be selected. This pruning is accomplished by the bidirectional_approx process of ID#5 which yields the approx_path matrix of FIG. 8E, lines 8–18. Note that subsequent to the pruning, the approx_path output by the bidirectional_approx process ID#5 is still overapproximate, but is overapproximate to a lesser extent.

As can be seen in the example of FIG. 7A, the bidirectional_approx process with ID#5 spawns off a simulate process with ID#6 (i.e., begins the second phase of a cycle as discussed above in Section 4.1) with the maximum priority level of 1.

The next step is to attempt to identify by a single step of simulation, in the state sets of time step 1 of the approx_path of ID#5, an actual state for $FSM_{verify}$ that can be reached from the initial state at time step 0. This single step of simulation is performed by the simulate process with ID#6 that is shown in detail in FIGS. 8F–G (see also FIG. 6H, lines 30–32 where bidirectional_approx ends by spawning a simulate process). In particular, FIG. 8G shows the result of the single simulation step. new_actual_path, the variable which contains an actual sequence of states from an initial state and hopefully towards a goal state, is augmented to contain a second state at time step 1 (note that in FIG. 8, actual_path is just shown as a sequence of states and the input combination for reaching the next state of he sequence is not shown). The approx_path matrix from process ID#5 is also disguarded by process ID#6 and a new_approx_path stepping stone matrix is created that only has a (relative) time step 0 state and that time step 0 state is the state just simulated to by process ID#6. See FIG. 6J, lines 8–10.

At this point a process, similar to the spawning of the processes with ID#'s 1,2 and 3, repeats. See FIG. 6J, lines 12–13 which contains the pseudo code by which simulate spawns a forward_approx process. From the simulate with process ID#6, two successive forward_approx processes, with ID#8 and ID#9, are spawned. These two forward approximation processes take the new "start state," of the new_approx_path stepping stone matrix of FIG. 8G, forward by two time steps. See FIG. 8I, lines 8–18, for an illustration of the stepping stone matrix resulting after the second of these two forward approximations is performed. After performing these two forward approximations, it is assumed for the purposes of this example that the state sets at (relative) time step 2, in FIG. 8I, lines 11–13, yield an intersection with a goal state. Assuming that the previous single simulation step of ID#6 did in fact lead to an actual state that is on a path to the goal state, this is presented herein as a plausible assumption. Since it had initially taken three time steps, when starting from an actual initial state of $FSM_{verify}$, to produce a set of states that intersected with a goal state at process ID#3, it is plausible to assume that starting from process ID#6, where a simulation step has already produced an advance of one time step, only another two time steps are necessary to once again intersect with a goal state.

In addition to the above described "central column" processes started by process ID#6, is is also important to note that simulate process ID#6 also spawns off an indefinite chain of simulations, limited only by priority level. As is shown, process ID#6 spawns off another simulate process with ID#7 at the next lower priority level and ID#7 itself spawns off another simulate process with ID#10 at a still lower priority of 3. By way of example, there is also shown simulation process ID#7 spawning off a forward_approx process ID#11. This indicates that simulate process ID#7 is also able to find another state actually reachable in one time step from the starting state, as simulate process ID#6 is able to do. Note however, that the forward_approx process with ID#11 has only a priority of 2, compared to priority 1 for forward_approx process ID#8, since the process of ID#11 is spawned with a level of priority equal to that of its parent simulation process ID#7. Other metrics for determining the priority of a spawned-off forward_approx process may be used. For example, the forward_approx process may be given a priority level proportional to the distance from the simulated-to state (i.e., the state reached by the execution of the simulate process) to max_time. This metric gives simulations which appear to be closer to an error state a greater chance of executing.

Another digression off the "central column" is also shown in FIG. 7A by forward_approx process ID#9 spawning off another forward_approx process ID#14 at an incrementally lower priority level.

Returning to a discussion of the "central column," we see that once again, in a manner similar to that discussed above for the foward_approx process ID#3 (which invoked bidirectional_approx process ID#5), foward_approx process ID#9 invokes the bidirectional_approx process ID#12. The bidirectional_approx of ID#12, shown in FIG. 8J, prunes the overapproximate two time-step approx_path of process ID#9 (and FIG. 8I). The pruned approx_path matrix produced process ID#12, and shown in FIG. 8J, is still overapproximate but is likely to be less overapproximate than the approx_path of process ID#9 that was passed to it.

Another single simulation step is then taken by the simulate process ID#13, which is shown in FIGS. 8K–L. As can be seen in FIG. 8L, the result of the second simulation is to produce a two time-step actual path. See the value for variable new_actual_path at FIG. 8L, line 3. A new stepping stone matrix is shown in FIG. 8L which has as its relative time step 0 state the just-simulated-to state of time step 2 of new_actual_path.

Only one forward_approx process, with ID#16, is then assumed to be necessary in order to produce a stepping stone matrix (as shown for the approx_path of FIG. 8M, lines 9–18) whose max_time state sets (in this case max_time is just the relative time step of 1) intersect a goal state.

A bidirectional_approx process with ID#17, shown in FIG. 8N, is then done to prune the overapproximate one time-step approx_path of process ID#16.

A third single step of simulation is then performed by process ID#18, from the relative "initial" state of the approx_path of process ID#17, to the relative time step 1. This third simulation is illustrated in FIG. 8O. As can be seen at FIG. 8O, lines 26–28, this third step of simulation ends the search and produces a three time-step path from an initial state of $FSM_{verify}$ to a goal state of $FSM_{verify}$.

If an error is not present in the $FSM_{verify}$ under test (i.e., a goal state cannot be reached), then the search procedure of the present invention will continue to spawn processes indefinitely.

Hardware Environment

Figure 9:
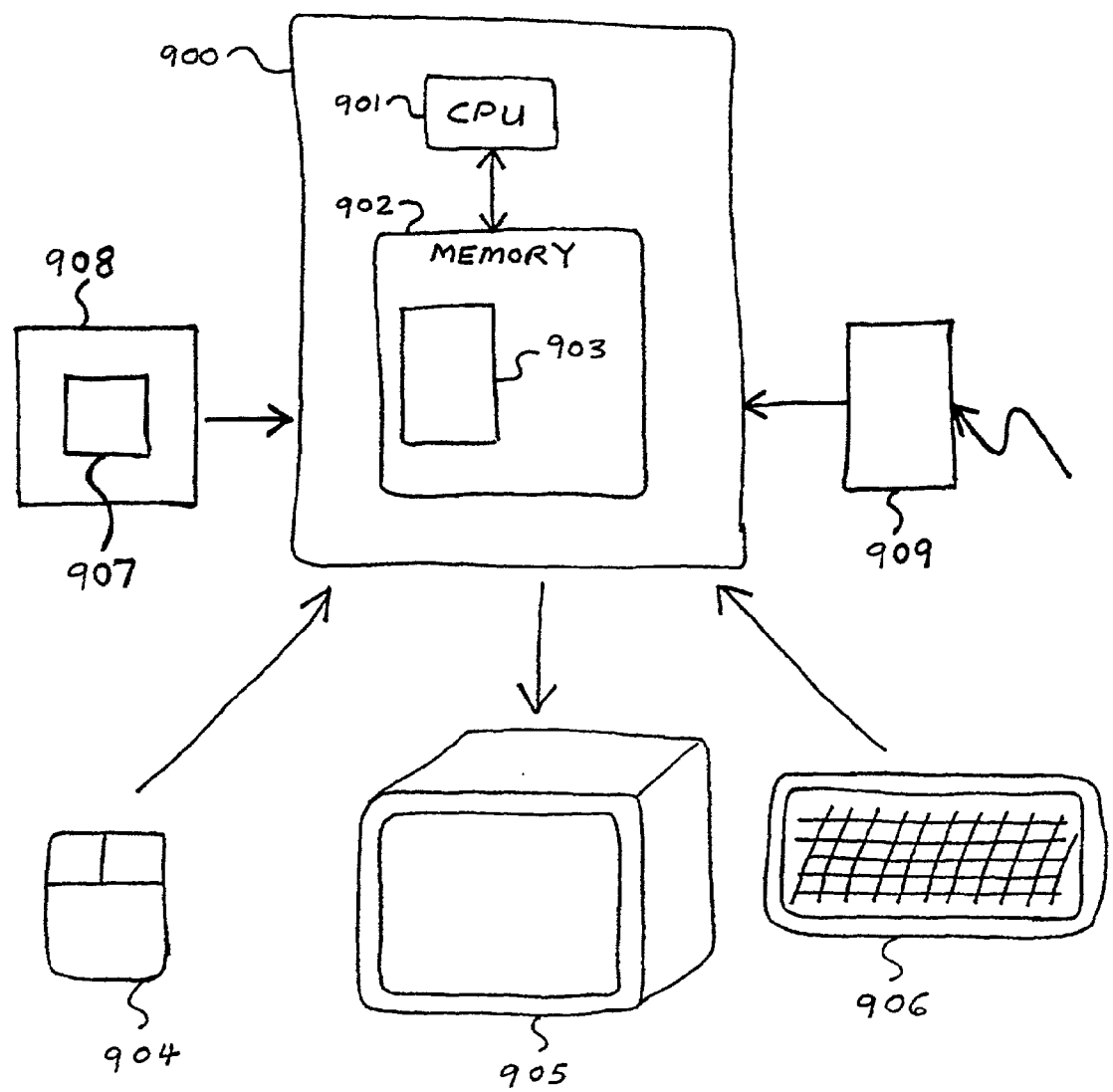
FIG. 9 represents a hardware environment for execution of the techniques of the present invention.
Figure 10:
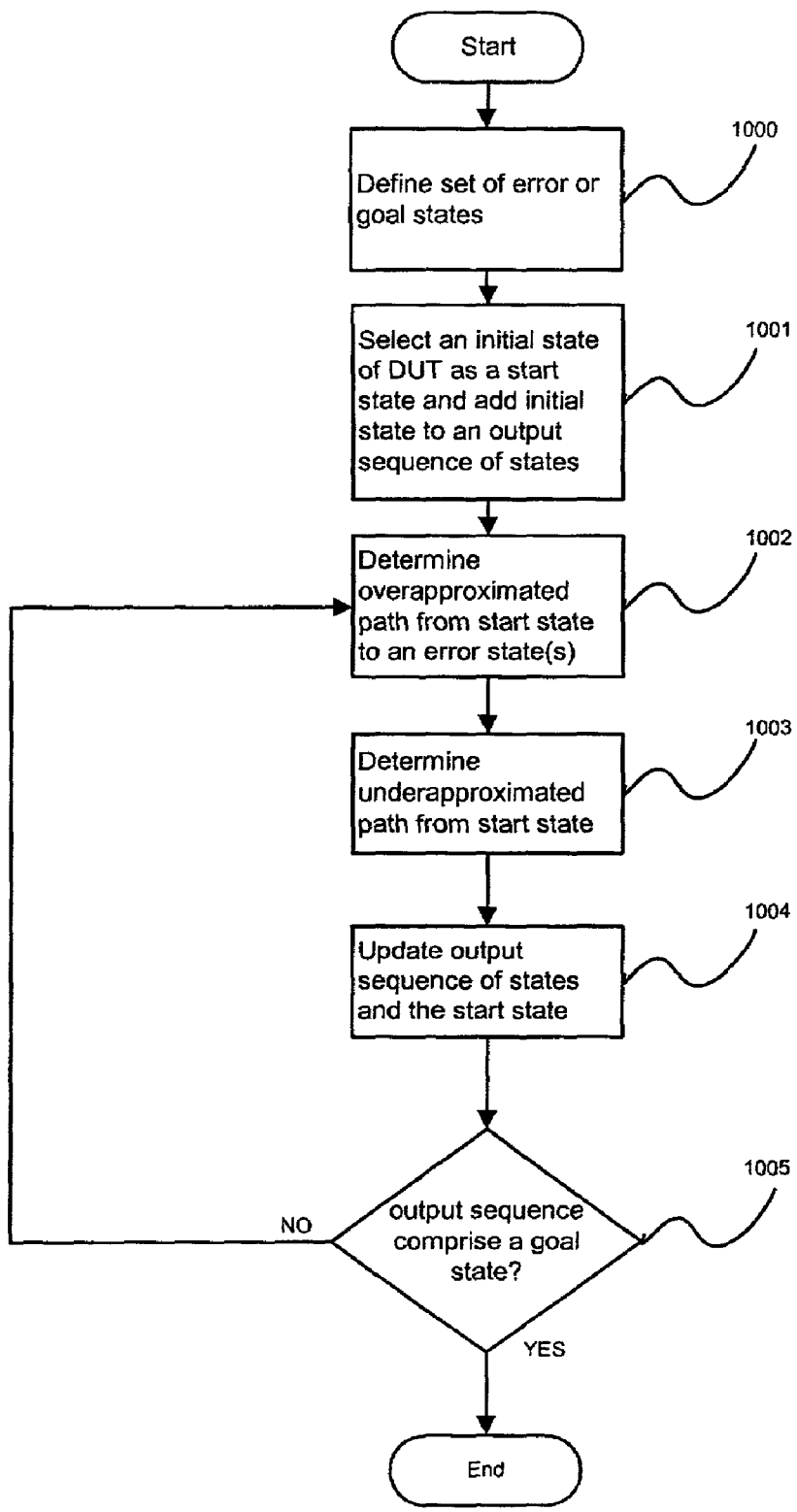
FIG. 10 depicts a basic overapproximation/underapproximation two-phase cycle in accordance with the present invention.
Figure 11:
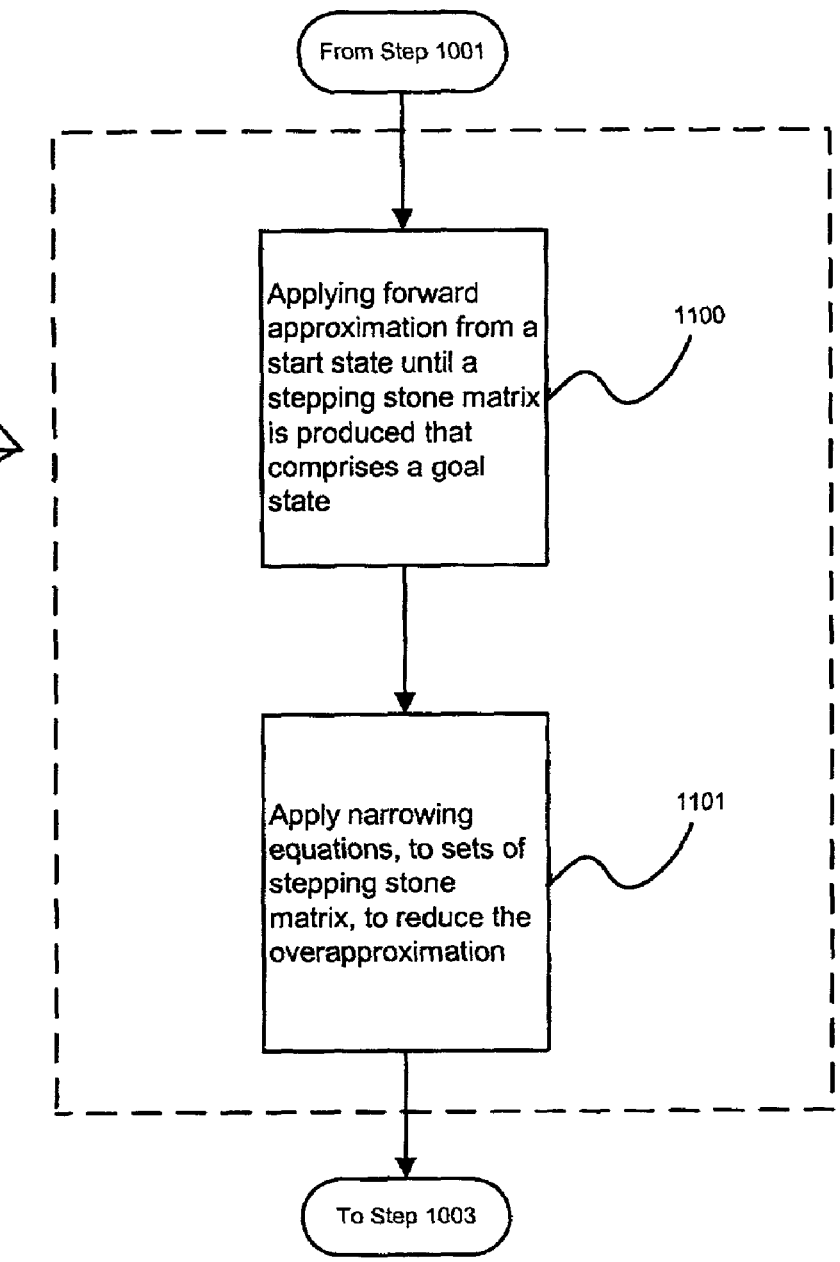
FIG. 11 represents the overapproximation phase of FIG. 10 in greater detail as itself being a two-part process.

Typically, the functional verification of the present invention is executed within a computing environment (or data processing system) such as that of FIG. 9. FIG. 9 depicts a workstation computer 900 comprising a Central Processing Unit (CPU) 901 (or other appropriate processor or processors) and a memory 902. Memory 902 has a portion 903 of its memory in which is stored the software tools and data of the present invention. While memory 903 is depicted as a single region, those of ordinary skill in the art will appreciate that, in fact, such software may be distributed over several memory regions or several computers. Furthermore, depending upon the computer's memory organization (such as virtual memory), memory 902 may comprise several types of memory (including cache, random access memory, hard disk and networked file server). Computer 900 is typically equipped with a display monitor 905, a mouse pointing device 904 and a keyboard 906 to provide interactivity between the software of the present invention and the chip designer. Computer 900 also includes a way of reading computer readable instructions from a computer readable medium 907, via a medium reader 908, into the memory 902. Computer 900 also includes a way of reading computer readable instructions via the Internet (or other network) through network interface 909. Software and data of the present invention may be embodied, in computer readable code devices, upon computer readable medium 907. Software and data of the present invention may be transmitted into memory portion 903, via network interface 909, by way of a data-carrying signal. Such data signal is typically either electronic or electromagnetic.

While the invention has been described in conjunction with specific embodiments, it is evident that many alternatives, modifications and variations will be apparent to those skilled in the art in light of the foregoing description. Accordingly, it is intended to embrace all such equivalents, alternatives, modifications and variations as fall within its spirit and scope.

What is claimed is:

1. A method of determining an output sequence of states in a finite state machine from an at least one input start state to an at least one input goal state, performed by a data processing system having a memory, comprising the steps of:
   determining an overapproximated path through the finite state machine, from an at least one first start state to an at least one first goal state, using a formal method, wherein the formal method is applied to a matrix comprised of state sets, the matrix being organized by time-steps along a first dimension and by partitions of state bits along a second dimension;
   determining a formally constrained underapproximated path that lies along the overapproximated path, the constrained path being of at least one time-step and comprising at least one state of the finite state machine;
   combining the constrained underapproximated path with the output sequence of states such that an updated output sequence of states and an updated at least one first start state are determined;
   ending a search, if the updated output sequence of states comprises at least one state of the at least one input start state and the at least one input goal state, but otherwise repeating the above steps.

2. The method of claim 1, wherein determining the overapproximated path is performed by a first process that is independent of a second process for determining of the formally constrained underapproximated path.

3. The method of claim 2, wherein the first process and second process exist concurrently.

4. The method of claim 2, wherein the first process spawns the second process.

5. The method of claim 2, wherein the repeating of steps is accomplished by spawning additional independent processes.

6. The method of claim 2, wherein the first process spawns a third process for determining a second overapproximated path that comprises the overapproximated path of the first process.

7. The method of claim 2, wherein the second process spawns a third process for determining a second constrained underapproximated path.

8. The method of claim 6, wherein third process has a third priority level and the first process has a first priority level.

9. The method of claim 7, wherein the second process has a second priority level and the third process has a third priority level.

10. The method of claim 1, wherein determining the overapproximated path comprises the steps of:
    applying a first formal method to augment the matrix, along the first dimension, until a time step is produced that comprises at least one state of the at least one first goal state; and
    applying a second formal method to lessen an amount of overapproximation of the matrix resulting from the first formal method.

11. The method of claim 1, wherein a first time-step of the matrix is comprised solely of a state or states reachable by the finite state machine in zero or more time-steps from the at least one input start state.

12. A method of determining an overapproximated path in a finite state machine from an at least one first start state to an at least one first goal state, performed by a data processing system having a memory, comprising the steps of:
    applying a first formal method to augment a matrix, along a first dimension, until a time step of the first dimension is produced that comprises at least one state of the at least one first goal state;
    applying a second formal method to lessen an amount of overapproximation of the matrix resulting from the first formal method; and
    wherein the matrix is comprised of state sets, is organized by time-steps along a first dimension, is organized by partitions of state bits along a second dimension, and the first time-step of the matrix is comprised solely of one or more states reachable by the finite state machine in zero or more time-steps from the at least one first start state.

13. The method of claim 12, wherein the second formal method narrows a target state set at a first time step by utilizing a first set of an earlier time step, wherein the first state set is in the fanin of target state set.

14. The method of claim 12, wherein the second formal method narrows a target set at a first time step by utilizing a first state set at a later time step, wherein the first state set is in the fanout of target set.

15. The method of claim 14, wherein the target set is a state set.

16. The method of claim 14, wherein the target set is an input set.

17. The method of claim 14, wherein the second formal method also utilizes at least one sibling set at an earlier time step than the first state set, wherein the at least one sibling set is in the fanin of the first state set.

18. The method of claim 17, wherein the at least one sibling set comprises a state set.

19. The method of claim 17, wherein the at least one sibling set comprises an input set.

20. The method of claim 13, wherein the second formal method is applied to the matrix in response to an event narrowing the first set.

21. The method of claim 14, wherein the second formal method is applied to the matrix in response to an event narrowing the first state set.

22. The method of claim 17, wherein the second formal method is applied to the matrix in response to an event narrowing an at least one sibling set.

23. The method of claim 13, wherein the first set is a state set.

24. The method of claim 13, wherein the first set is an input set.

25. The method of claim 12, wherein the second formal method is applied as follows:
    retrieving a current target state set, of a first time step, from a list of forward narrowing targets;
    performing a forward narrowing of the current target state set, by utilizing a first set of a time step earlier than the first time step, wherein the first set is in the fanin of current target state set;
    identifying additional forward narrowing targets, resulting from the forward narrowing of the current target state set;
    adding the additional forward narrowing targets to the list of forward narrowing targets;
    repeating the above steps if the list of forward narrowing targets contains targets for forward narrowing.

26. The method of claim 23, wherein the list of forward narrowing targets is ordered by increasing time step of a target state set upon the addition of the additional forward narrowing targets.

27. The method of claim 12, wherein the second formal method is applied as follows:
    retrieving a current state set, of a first time step, from a list of reverse narrowing sources;
    performing a reverse narrowing of a current target set, by utilizing the current state set, wherein the current target set is in the fanin of current state set and the current target set is at an earlier time step than the first time step;
    identifying additional reverse narrowing targets, resulting from the reverse narrowing of the current target set;
    adding the additional reverse narrowing sources to the list of reverse narrowing targets based upon the identified additional reverse narrowing targets;
    repeating the above steps if the list of reverse narrowing sources contains state sets.

28. The method of claim 27, wherein the list of reverse narrowing sources is ordered by decreasing time step of a state set upon the addition of the additional reverse narrowing sources.

29. A data processing system having a memory, for determining an output sequence of states in a finite state machine from an at least one input start state to an at least one input goal state, comprising:
    a subsystem configured to determine an overapproximated path through the finite state machine, from an at least one first start state to an at least one first goal state, using a formal method, wherein the formal method is applied to a matrix comprised of state sets, the matrix being organized by time-steps along a first dimension and by partitions of state bits along a second dimension;
    a subsystem configured to determine a formally constrained underapproximated path that lies along the overapproximated path, the constrained path being of at least one time-step and comprising at least one state of the finite state machine;

a subsystem configured to combine the constrained underapproximated path with the output sequence of states such that an updated output sequence of states and an updated at least one first start state are determined;

a subsystem configured to end a search, if the updated output sequence of states comprises at least one state of the at least one input start state and the at least one input goal state, but to otherwise repeat application of the above circuits.

30. A data processing system having a memory, for determining an overapproximated path in a finite state machine from an at least one first start state to an at least one first goal state, comprising:

a subsystem configured to apply a first formal method to augment a matrix, along a first dimension, until a time step of the first dimension is produced that comprises at least one state of the at least one first goal state;

a subsystem configured to apply a second formal method to lessen an amount of overapproximation of the matrix resulting from the first formal method; and wherein the matrix is comprised of state sets, is organized by time-steps along a first dimension, is organized by partitions of state bits along a second dimension, and the first time-step of the matrix is comprised solely of one or more states reachable by the finite state machine in zero or more time-steps from the at least one first start state.

31. A computer program product comprising:

a computer usable medium having computer readable code embodied therein for causing a data processing system having a memory to determine an output sequence of states in a finite state machine from an at least one input start state to an at least one input goal state, the computer program product including:

computer readable program code devices configured to cause a computer to effect determining an overapproximated path through the finite state machine, from an at least one first start state to an at least one first goal state, using a formal method, wherein the formal method is applied to a matrix comprised of state sets, the matrix being organized by time-steps along a first dimension and by partitions of state bits along a second dimension;

computer readable program code devices configured to cause a computer to effect determining a formally constrained underapproximated path that lies along the overapproximated path, the constrained path being of at least one time-step and comprising at least one state of the finite state machine;

computer readable program code devices configured to cause a computer to effect combining the constrained underapproximated path with the output sequence of states such that an updated output sequence of states and an updated at least one first start state are determined;

computer readable program code devices configured to cause a computer to effect ending a search, if the updated output sequence of states comprises at least one state of the at least one input start state and the at least one input goal state, but otherwise repeating the above steps.

32. A computer program product comprising:

a computer usable medium having computer readable code embodied therein for causing a data processing system having a memory to determine an overapproximated path in a finite state machine from an at least one first start state to an at least one first goal state, the computer program product including:

computer readable program code devices configured to cause a computer to effect applying a first formal method to augment a matrix, along a first dimension, until a time step of the first dimension is produced that comprises at least one state of the at least one first goal state;

computer readable program code devices configured to cause a computer to effect applying a second formal method to lessen an amount of overapproximation of the matrix resulting from the first formal method; and wherein the matrix is comprised of state sets, is organized by time-steps along a first dimension, is organized by partitions of state bits along a second dimension, and the first time-step of the matrix is comprised solely of one or more states reachable by the finite state machine in zero or more time-steps from the at least one first start state.

33. A data-carrying signal representing sequences of instructions which, when executed by a data processing system, cause determination of an output sequence of states in a finite state machine from an at least one input start state to an at least one input goal state by performing the steps of:

determining an overapproximated path through the finite state machine, from an at least one first start state to an at least one first goal state, using a formal method, wherein the formal method is applied to a matrix comprised of state sets, the matrix being organized by time-steps along a first dimension and by partitions of state bits along a second dimension;

determining a formally constrained underapproximated path that lies along the overapproximated path, the constrained path being of at least one time-step and comprising at least one state of the finite state machine;

combining the constrained underapproximated path with the output sequence of states such that an updated output sequence of states and an updated at least one first start state are determined;

ending a search, if the updated output sequence of states comprises at least one state of the at least one input start state and the at least one input goal state, but otherwise repeating the above steps.

34. A data-carrying signal representing sequences of instructions which, when executed by a data processing system, cause determination of an overapproximated path in a finite state machine from an at least one first start state to an at least one first goal state by performing the steps of:

applying a first formal method to augment a matrix, along a first dimension, until a time step of the first dimension is produced that comprises at least one state of the at least one first goal state;

applying a second formal method to lessen an amount of overapproximation of the matrix resulting from the first formal method; and wherein the matrix is comprised of state sets, is organized by time-steps along a first dimension, is organized by partitions of state bits along a second dimension, and the first time-step of the matrix is comprised solely of one or more states reachable by the finite state machine in zero or more time-steps from the at least one first start state.

* * * * *